United States Patent
Toda et al.

(10) Patent No.: US 7,692,951 B2
(45) Date of Patent: *Apr. 6, 2010

(54) RESISTANCE CHANGE MEMORY DEVICE WITH A VARIABLE RESISTANCE ELEMENT FORMED OF A FIRST AND A SECOND COMPOSITE COMPOUND

(75) Inventors: Haruki Toda, Yokohama (JP); Koichi Kubo, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 15 days.

This patent is subject to a terminal disclaimer.

(21) Appl. No.: 12/140,818

(22) Filed: Jun. 17, 2008

(65) Prior Publication Data

US 2008/0310211 A1   Dec. 18, 2008

Related U.S. Application Data

(63) Continuation of application No. 11/761,397, filed on Jun. 12, 2007, now Pat. No. 7,400,522.

(51) Int. Cl.
  *G11C 11/00*  (2006.01)
(52) U.S. Cl. .................. 365/148; 365/163; 365/230.03
(58) Field of Classification Search ................ 365/163, 365/148, 130, 230.03
  See application file for complete search history.

(56) References Cited

U.S. PATENT DOCUMENTS

| | | | |
|---|---|---|---|
| 3,997,883 A | 12/1976 | Wong et al. | |
| 5,991,193 A | 11/1999 | Gallagher et al. | |
| 6,072,716 A | 6/2000 | Jacobson et al. | |
| 6,418,049 B1 | 7/2002 | Kozicki et al. | |
| 6,504,742 B1 | 1/2003 | Tran et al. | |
| 6,567,301 B2 | 5/2003 | Anthony et al. | |
| 6,635,914 B2 | 10/2003 | Kozicki et al. | |
| 6,815,744 B1 | 11/2004 | Beck et al. | |
| 7,400,522 B2* | 7/2008 | Toda et al. ............ | 365/148 |
| 7,459,715 B2* | 12/2008 | Toda et al. ............ | 257/2 |
| 7,459,716 B2* | 12/2008 | Toda et al. ............ | 257/2 |
| 2002/0168820 A1 | 11/2002 | Kozicki et al. | |
| 2003/0031047 A1 | 2/2003 | Anthony et al. | |
| 2007/0133358 A1 | 6/2007 | Kubo et al. | |
| 2007/0285969 A1* | 12/2007 | Toda et al. ............ | 365/148 |
| 2008/0002457 A1* | 1/2008 | Toda et al. ............ | 365/148 |

FOREIGN PATENT DOCUMENTS

| | | |
|---|---|---|
| EP | 0 337 393 A2 | 10/1989 |
| EP | 0 495 494 A1 | 7/1992 |

(Continued)

*Primary Examiner*—Andrew Q Tran
(74) *Attorney, Agent, or Firm*—Oblon, Spivak, McClelland, Maier & Neustadt, L.L.P.

(57) ABSTRACT

A resistance change memory device including: a semiconductor substrate; at least one cell array formed above the semiconductor substrate, each memory cell having a stack structure of a variable resistance element and an access element, the access element having such an off-state resistance value in a certain voltage range that is ten times or more as high as that in a select state; and a read/write circuit formed on the semiconductor substrate as underlying the cell array, wherein the variable resistance element comprises a recording layer formed of a first composite compound expressed by $A_xM_yO_z$ (where "A" and "M" are cation elements different from each other; "O" oxygen; and $0.5 \leq x \leq 1.5$, $0.5 \leq y \leq 2.5$ and $1.5 \leq z \leq 4.5$) and a second composite compound containing at least one transition element and a cavity site for housing a cation ion.

20 Claims, 27 Drawing Sheets

Spinel ($AM_2O_4$)

| M<br>A | Al | Ge:Ni=<br>0.5:0.5 | Sn:Ni=<br>0.5:0.5 | Ti:Ni=<br>0.5:0.5 | V | Cr | Mn | Fe | Co |
|---|---|---|---|---|---|---|---|---|---|
| Mg | | O | O | O | O | O | O | O | O |
| Zn | | O | O | O | O | O | O | O | O |
| Cu | O | O | O | O | O | O | O | O | O |
| Cr | O | | | | O | | | | |
| Mn | O | | | | O | O | | | |
| Fe | O | | | | O | O | O | | |
| Co | O | | | | O | O | O | O | |

Ramsdelite ($A_xMO_2$)

| M<br>A | Ti | Mn |
|---|---|---|
| Zn (small amount) | O | O |
| Mg (small amount) | O | O |
| — | O | O |

FOREIGN PATENT DOCUMENTS

| | | |
|---|---|---|
| EP | 1 081 714 A1 | 3/2001 |
| EP | 1 265 286 A2 | 12/2002 |
| WO | WO 02/47089 A2 | 6/2002 |
| WO | WO 03/085675 A2 | 10/2003 |
| WO | WO 03/085675 A3 | 10/2003 |
| WO | WO 2004/084228 A1 | 9/2004 |
| WO | WO 2004/084229 A1 | 9/2004 |
| WO | WO 2004/090984 A1 | 10/2004 |

* cited by examiner

"0" Write ($V_{AK} < 0$)

"1" Write ($V_{AK} > 0$)

FIG. 33
Spinel (AM2O4)

| A \ M | Al | Ge:Ni=0.5:0.5 | Sn:Ni=0.5:0.5 | Ti:Ni=0.5:0.5 | V | Cr | Mn | Fe | Co |
|---|---|---|---|---|---|---|---|---|---|
| Mg |  | O | O | O | O | O | O | O | O |
| Zn |  | O | O | O | O | O | O | O | O |
| Cu | O | O | O | O | O | O | O | O | O |
| Cr | O |  |  |  | O |  |  |  |  |
| Mn | O |  |  |  | O | O |  |  |  |
| Fe | O |  |  |  | O | O | O |  |  |
| Co | O |  |  |  | O | O | O | O |  |

FIG. 34
Ilmenite (AMO3)

| A \ M | Ge | Sn | Ti | Ta(Nb) | Mn | Fe:Nb(Ta)=0.5:0.5 | Co:Nb(Ta)=0.5:0.5 | Ni:Mo(W)=0.5:0.5 | Cu:Mo(W)=0.5:0.5 |
|---|---|---|---|---|---|---|---|---|---|
| Mg | O | O | O |  | O | O | O | O | O |
| Zn | O | O | O |  | O | O | O | O | O |
| Cr | O | O | O |  |  |  |  |  |  |
| Mn | O | O | O |  |  |  |  |  |  |
| Fe | O | O | O |  |  |  |  |  |  |
| Co | O | O | O |  |  |  |  |  |  |
| Ni | O | O | O |  |  |  |  |  |  |
| Cu | O | O | O | O | O |  |  |  |  |

FIG. 35
Delafossite (AMO2)

| A \ M | Al | Ge:Ni=0.5:0.5 | Sn:Ni=0.5:0.5 | Ti:Ni=0.5:0.5 | V | Cr | Mn | Fe | Co | Sc | Y | Lanthanoid (except Ce,Tb) |
|---|---|---|---|---|---|---|---|---|---|---|---|---|
| Cu | O | O | O | O |  | O |  | O | O | O |  | O |

FIG. 36

LiMoN2 (AMN2)

| A \ M | Mo(W) | Nb(Ta) |
|---|---|---|
| Mg | ○ | |
| Zn | ○ | |
| Cr | ○ | |
| Mn | ○ | |
| Fe | ○ | |
| Co | ○ | |
| Ni | ○ | |
| Cu | ○ | |
| Al | | ○ |
| In | | ○ |
| Cr | | ○ |

FIG. 37

Wolframite (AMO4)

| A \ M | Mo(W) | Nb(Ta) |
|---|---|---|
| Mg | ○ | |
| Zn | ○ | |
| Cr | ○ | |
| Mn | ○ | |
| Fe | ○ | |
| Co | ○ | |
| Ni | ○ | |
| Cu | ○ | |
| Al | | ○ |
| In | | ○ |
| Cr | | ○ |

FIG. 38

Olivin (A2MO4)

| A \ M | Si(Ge) | P |
|---|---|---|
| Mg | O | |
| Zn | O | |
| Cr | O | |
| Mn | O | |
| Fe | O | |
| Co | O | |
| Ni | O | |
| Cu | O | |
| Cu:Zn=1:1 | | O |
| Cu:Mg=1:1 | | O |
| Cu:Ni=1:1 | | O |
| Cu:Mn=1:1 | | O |
| Cu:Co=1:1 | | O |

FIG. 39

Hollandite (AxMO2)

| A \ M | Ti | Mn |
|---|---|---|
| Ba (small amount) | O | O |
| Sr (small amount) | O | O |
| Ca (small amount) | O | O |
| — | O | O |

FIG. 40

Ramsdelite (AxMO2)

| A \ M | Ti | Mn |
|---|---|---|
| Zn (small amount) | O | O |
| Mg (small amount) | O | O |
| — | O | O |

FIG. 41

Perovskite (AMO3)

| M\A | Al | Ga | Ti | V | Cr | Mn | Fe | Co | Ni |
|---|---|---|---|---|---|---|---|---|---|
| Ca |  |  | O | O | O | O |  |  |  |
| Sr |  |  | O | O | O | O |  |  |  |
| Ba |  |  | O | O | O | O |  |  |  |
| La | O | O | O | O | O | O | O | O | O |
| Y | O | O | O | O | O | O | O | O | O |
| Lanthanoid (except Ce,Tb) | O | O | O | O | O | O | O | O | O |

RESISTANCE CHANGE MEMORY DEVICE WITH A VARIABLE RESISTANCE ELEMENT FORMED OF A FIRST AND A SECOND COMPOSITE COMPOUND

CROSS REFERENCE TO RELATED APPLICATION

This is a continuation of U.S. application Ser. No. 11/761, 397, filed on Jun. 12, 2007, now U.S. Pat. No. 7,400,522, issued Jul. 15, 2008. U.S. application Ser. No. 11/761,397 is incorporated herein by reference.

BACKGROUND OF THE INVENTION

1. Field of the Invention

This invention relates to a resistance change memory device, which stores a resistance value determinable by a resistance change of memory material in a non-volatile manner.

2. Description of the Related Art

Recently, there have been proposed some memory devices having variable resistance elements. One of such the memory devices is known as a phase change memory which uses phase transition between an amorphous state and a crystalline state of a memory material (for example, U.S. Pat. No. 6,314, 014B1). In such the phase change memory device, by controlling the current of a chalcogenide cell, reversible switching may be performed between a crystalline state (i.e. low resistance state) and an amorphous state (i.e. high resistance state). Apply a large current to a cell so as to cause the cell chalcogenide to be melted, then rapidly cool down it, and a low resistance state may be written. Anneal the chalcogenide in such a degree as to crystallize it without melting, and a high resistance state may be written. Therefore, it is possible to obtain an electrically rewritable non-volatile memory device.

Other programmable resistance memories have been proposed as including programmable resistances switchable between a low resistance state and a high resistance state by reversing the polarity of voltage application. One of these has an ion conductor formed of a chalcogenide containing metals (for example, U.S. Pat. No. 6,418,049B1), and another one has a polymer in which conductive particles are dispersed (for example, U.S. Pat. No. 6,072,716). In these memories, dendrite growth and retraction thereof in a solid by voltage application are used. In order to write a low resistance state into a cell, a voltage is applied between the anode and cathode of a cell in such a polarity that the anode is positive. As a result, a dendrite grows from the cathode to reach the anode, whereby the cell becomes to be a low resistance state. A reverse voltage application retracts the dendrite to cause the cell to be in a high resistance state. Such the resistance change is reversible, and the low resistance state and the high resistance state may be stored in a non-volatile manner.

It has been suggested that it is possible to achieve an electrically rewritable non-volatile memory with a high density by use of such the programmable resistance. However, there has not been proposed a detailed configuration of a cell array and a read/write circuit thereof. In order to achieve a practical non-volatile memory with a high density and a high performance, how to combine the programmable resistance with what kinds of switching devices for constituting a cell array, how to construct the read/write circuit in communication with the cell array, and the like become important technical issues.

SUMMARY OF THE INVENTION

A resistance change memory device in accordance with an aspect of the invention including:

a semiconductor substrate;

at least one cell array, in which memory cells are arranged, formed above the semiconductor substrate, each the memory cell having a stack structure of a variable resistance element and an access element, the variable resistance element storing a high resistance state or a low resistance state in a non-volatile manner, the access element having such an off-state resistance value in a certain voltage range that is ten times or more as high as that in a select state; and a read/write circuit formed on the semiconductor substrate as underlying the cell array for data reading and data writing in communication with the cell array, wherein the variable resistance element includes a recording layer formed of a first composite compound expressed by $A_xM_yO_z$ (where "A" and "M" are cation elements different from each other; "O" oxygen; and $0.5 \leq x \leq 1.5$, $0.5 \leq y \leq 2.5$ and $1.5 \leq z \leq 4.5$) and a second composite compound containing at least one transition element and a cavity site for housing a cation ion.

BRIEF DESCRIPTION OF THE DRAWINGS

FIGS. 33 to 41 show compound examples usable in this embodiment.

DETAILED DESCRIPTION OF THE EMBODIMENTS

Figure 1:
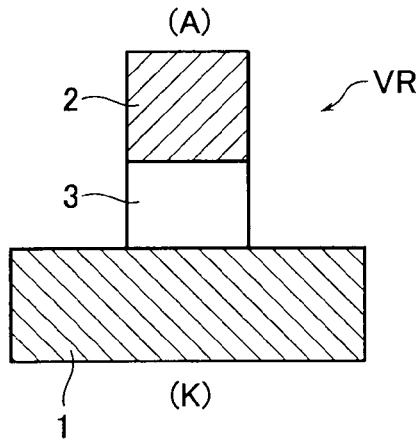
FIG. 1 is a diagram for explaining the principle of data write for a programmable resistance memory element according to an embodiment of the present invention.
Figure 1:
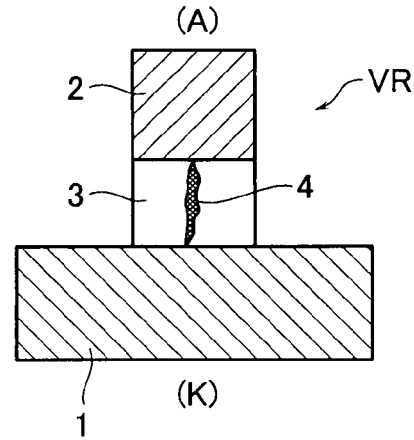

FIG. 1 shows a principle configuration of a programmable resistance (variable resistance) VR used in the present invention. The programmable resistance VR is formed of a resistance film 3 as being a memory material, and cathode, anode electrodes 1, 2 that sandwiches the resistance film 3.

The resistance film 3 is, for example, an ion conductor (solid electrolyte) formed of a chalcogenide containing metal ions such as silver, cupper and the like. For example, Ge—S, Ge—Se and the like may be used as the chalcogenide. When the resistance film 3 is formed of the above-described chalcogenide, the electrodes 1, 2 are also formed containing silver therein.

The resistance film 3 stores, for example, a high resistance state as a data "0" and a low resistance state as a data "1". In this programmable resistance VR, apply a positive anode-cathode voltage ($V_{AK}>0$) that is over a threshold value, and a data "1" will be written. Apply a negative anode-cathode voltage ($V_{AK}<0$) that is over a threshold value, and a data "0" will be written. When "1" data is written, as a result of the voltage application of $V_{AK}>0$, a conductive dendrite 4 grows from the cathode electrode 1 toward the anode electrode 2 in the resistance film 3 as shown in FIG. 1. When the dendrite 4 reaches the anode electrode 2, the high resistance state (data "1") is obtained. Apply a reverse voltage, and the dendrite 4 is retracted or broken, whereby the low resistance state (data "0") is obtained. Such the low resistance state and the high resistance state may be statically held as far as a voltage is not applied over the threshold.

It should be appreciated that the resistance film 3 may be formed of a polymer in which conductive particles are dispersed (for example, carbon polymer in which carbon black particles are dispersed). In this case, a low resistance state and a high resistance state are reversibly written based on the same principle as above-described.

The principle of the above-described memory operation is based on a mechanism as described below. An ion conductor or a polymer is amorphous, and potential barriers are formed at random and statically therein. In addition, in the potential barrier distribution, potential valleys are formed continuously from the cathode to the anode. Disperse some kinds of metals in such a solid material, and it is possible to move metal ions along the potential valleys due to electric field application. When a voltage is applied in such a polarity that anode side is positive, metal ions move toward the cathode, and then metal dendrite grows from the cathode electrode. Reverse the polarity of the electric field, and the metals in the dendrite is charged and separated from the dendrite, then move toward the cathode along the potential valleys. As a result, the dendrite may be retracted.

Data read of such the programmable resistance VR may be performed by current monitoring when a voltage is applied to the programmable resistance VR with such a degree that dendrite growth and retraction thereof do not occur.

Alternatively, it is possible to use a large read voltage without data disturbance in a condition that it has such a polarity as to accelerate the data "0", "1" state.

Figure 2:
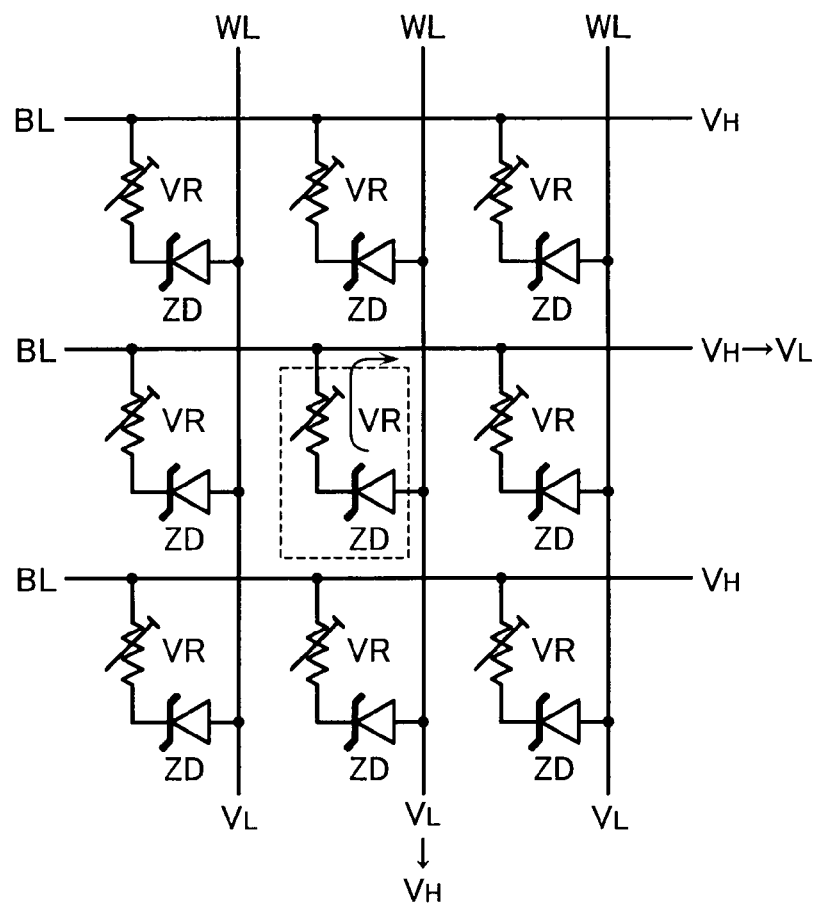
FIG. 2 is shows a basic cell array and a voltage application mode thereof for a selected cell according to the embodiment.

FIG. 2 shows a basic cell array of a programmable resistance memory in accordance with an embodiment, with respect to a 3×3 cell matrix. A plurality of first wirings (hereinafter, bit lines BL) are provided in parallel, and a plurality of second wirings (hereinafter, word lines WL) are provided to cross the bit lines BL. Memory cells MC are laid out at the respective crossing points of these word lines WL and bit lines BL. The memory cell MC is a series-connection circuit of a programmable resistance VR and a Zener diode ZD. The anode of Zener diode ZD is connected to word lines WL.

In a non-select state, the bit lines BL are held at a high level voltage $V_H$, and the word lines WL are held at a low level voltage $V_L$. In this state, Zener diodes ZD are in a reverse-biases state and thus are in an off-state. FIG. 2 shows such a case that cell selection is performed by use of a forward-bias characteristic of the Zener diode ZD.

Therefore, in order to select a cell MC, which is surrounded by broken lines, let a selected word line WL at the high level voltage $V_H$, and let a selected bit line BL at the low level voltage $V_L$; whereby, at the selected cell, its diode ZD becomes forward-biased to be in an on-state, and a voltage is applied to one programmable resistance VR.

Figure 3:
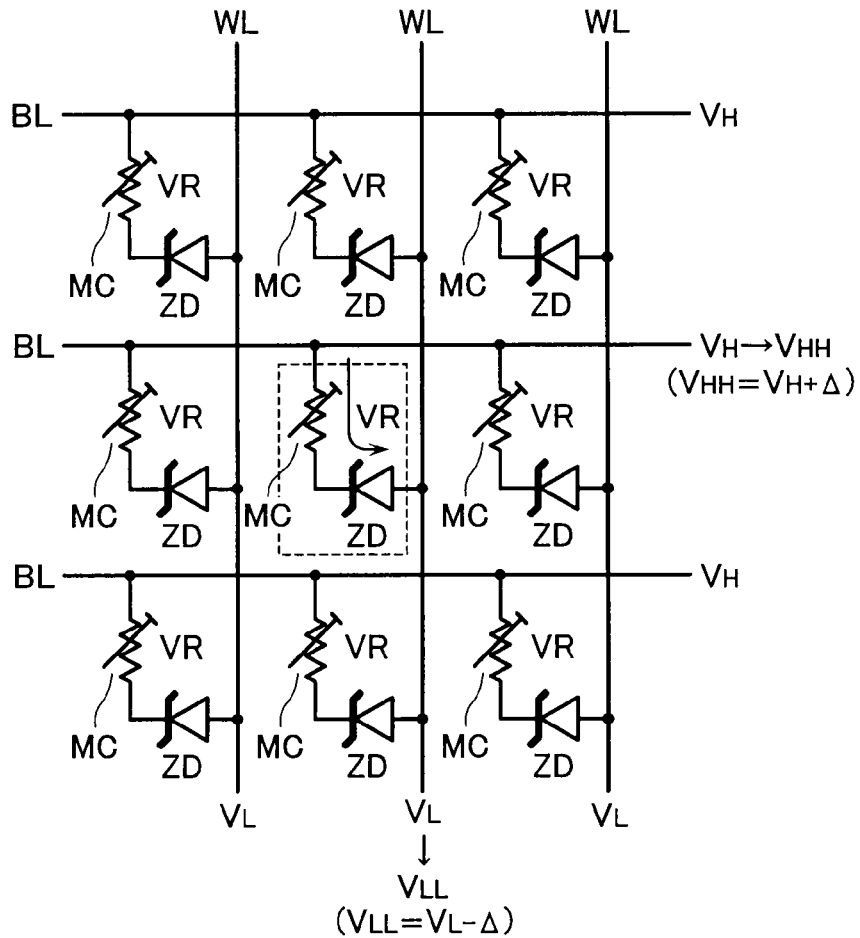
FIG. 3 shows another voltage application mode for the selected cell in the basic cell array.

FIG. 3 shows such a case that a reverse bias is applied to the programmable resistance VR in the same cell array shown in FIG. 2. In this case, breakdown of the Zener diode ZD is used. Zener breakdown is generated by band to band tunneling of the diode junction, and breakdown start voltage (Zener voltage) Vz may be controlled by the impurity concentration of the diode. As similar to FIG. 2, in a non-select state, the bit lines BL are held at a high level voltage $V_H$, and the word lines WL are held at a low level voltage $V_L$. In order to select a cell MC, which is surrounded by broken lines, let a selected word line WL at a low level voltage $V_{LL}$ lower than $V_L$, and let a selected bit line BL at a high level voltage $V_{HH}$ higher than $V_H$ (for example, $V_{LL}=V_L-\Delta$, $V_{HH}=V_H+\Delta$, where $\Delta$ is a voltage level variation); whereby, at the selected cell, a large backward bias is applied to the diode ZD, thereby causing it breakdown.

As a result, a voltage with a polarity opposite to that in FIG. 2 may be applied to one programmable resistance VR.

The above-described level relationship is an example. For example, in FIG. 2, although the non-selected bit lines and selected word line are set at the same high level voltage $V_H$, and non-selected word lines and selected bit line are set at the same low level voltage $V_L$, it is not necessary to use the same levels in these cases. With respect to the voltage variation Δ used in the select mode in FIG. 3, it is not necessary to use the same value for the bit line and word line.

In this embodiment, the cell selection method, in which the forward bias characteristic of the diode is used as shown in FIG. 2, is used for "0" data write and data read; and the cell selection method, in which the backward breakdown of the diode is used as shown in FIG. 3, is used for "1" data write. Giving attention to one memory cell, read and write characteristics will be described in detail, referring to FIGS. 4 and 5.

Figure 4:
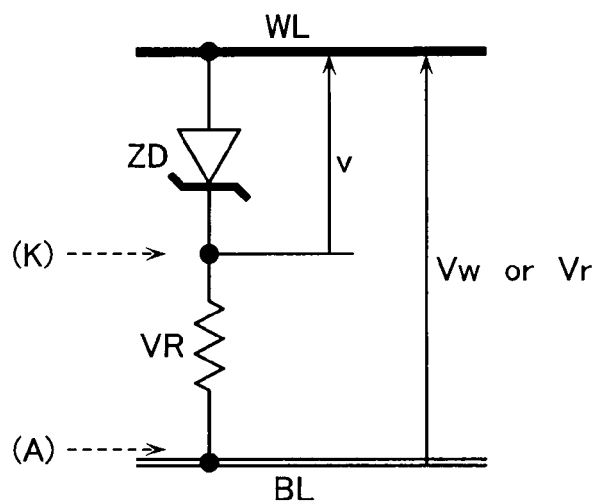
FIG. 4 shows a read/write voltage relationship for a unit cell.

FIG. 4 shows a relationship between a read voltage Vr, a write voltage Vw and a voltage of Zener diode ZD. Programmable resistance VR is connected with such a polarity that anode (A) thereof is connected to the bit line BL. The read voltage Vr and write voltage Vw are ones between word line WL and bit line BL.

Figure 5:
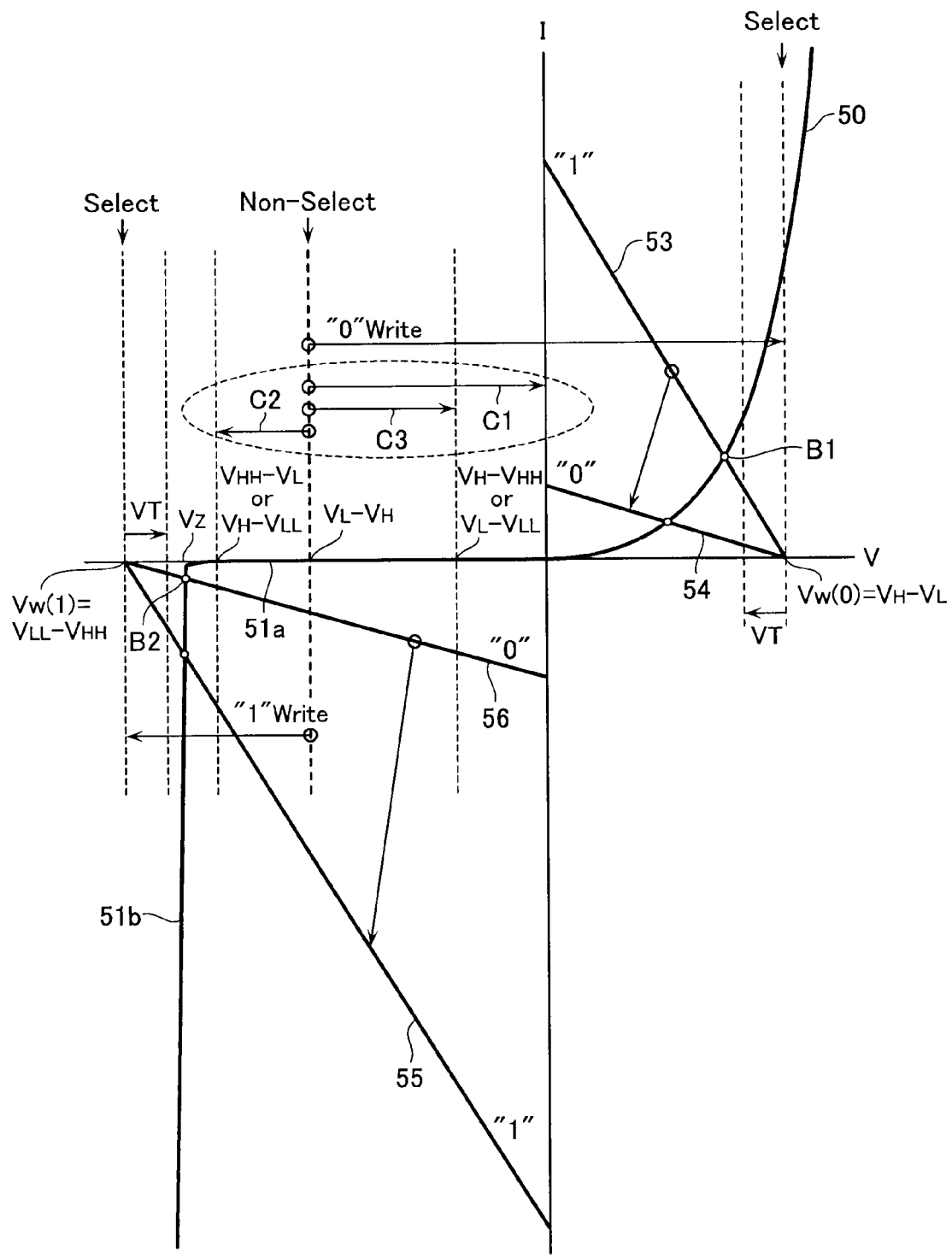
FIG. 5 shows a cell characteristic for explaining a write principle.

FIG. 5 shows characteristic changes of the programmable resistance VR in accordance with write operations by use of a voltage (V)-current (I) characteristic of the diode ZD and a V-I characteristic (i.e., load line) of the programmable resistance VR. In the first quadrant, a forward-bias characteristic curve 50 of the diode ZD is shown. This is expressed as follows; $I=I_0\{exp(qV/kT)-1\}$. The third quadrant shows backward-bias characteristic curves 51a, 51b of the diode ZD. In the non-select state, the voltage applied to the cell is $V_L-V_H$, thus the diode ZD is held at a high-impedance off-state on the curve 51a In the first quadrant of FIG. 5, "0" write operation is performed as follows. Apply a write voltage $Vw(0)=V_H-V_L$ in such a condition that Zener diode ZD becomes to be an on-state, and the cell held in a "1" data state (i.e., low resistive state) 53 is written into a "0" data state (i.e., high resistive state) 54. In principle, it is possible to use the first quadrant characteristic for "0" writing or for "1" writing.

However, since it is required to use this quadrant for cell data reading as described later, "0" write operation is performed in the first quadrant. This can be the in other words that the programmable resistance VR is connected with such a polarity that anode (A) thereof is connected to the bit kine BL in the cell array configuration shown in FIGS. 2 to 4. Corresponding with the write voltage application, a load line 53 of "1" data state changes to a load line 54 of "0" data state, as shown by an arrow, as a result of that the dendrite of the programmable resistance is retracted, and resistance value thereof becomes high.

In order to cause the programmable resistance of "1" data to take place such the change, it is required that a voltage higher than a certain level is applied to the programmable resistance. Such the level is shown as a "0" write threshold value VT in FIG. 5. VT is a voltage applied to the programmable resistance VR, and expressed as a negative voltage with reference to Vw(0). If the cross point B1 between the forward bias characteristic curve 50 of the Zener diode ZD and the load line 53 of "1" data state of the programmable resistance is positioned between the origin and Vw(0)−VT, "0" write may be done into the programmable resistance. As described above, use the first quadrant for "0" write, and it becomes hard to occur error write to the programmable resistance in a read mode. The reason of this will be described in detail later.

In the third quadrant, "1" write is performed. In this case, apply a large backward bias, and it may cause the Zener diode breakdown, and it allows of current flowing with an approximately constant voltage. In the drawing, "1" write operation is shown as follows; when write voltage $Vw(1)=V_{LL}-V_{HH}$ is applied as being over the breakdown voltage (Zener voltage) Vz, the programmable resistance VR changes from a high resistive state 56 of "0" data to a low resistive state 55 of "1" data. Load lines 56, 55, which express "0", "1" states respectively, have inclinations in correspondence with resistance values.

Therefore, these are in parallel with the load lines 53, 54 in the first quadrant, respectively. In this case, it is also required for successfully writing to the programmable resistance that a voltage higher than a threshold value VT is applied to it. If the cross point B2 between the breakdown characteristic curve 51b of the Zener diode ZD and the load line 56 of "0" data state of the programmable resistance is positioned between the origin and Vw(1)+VT, "1" write may be done into the programmable resistance. Voltages $V_{LL}$, $V_{HH}$ and the like are selected in such a condition that sufficiently high voltage is applied to the programmable resistance.

If the resistance value of "1" data written programmable resistance is too low, a large current will flow through the Zener diode ZD, thereby causing it thermal breakdown.

Therefore, it is required to give attention to the current value. Corresponding to some cases, it will be necessary to dispose a current limiter.

If the third quadrant is used for "0" writing, there is not any fear of thermal breakdown, because the load line variation due to writing is in such a direction that the current value decreases. In this case, however, since it is required to use the first quadrant for "1" writing, the possibility of erroneous writing in a read operation is undeniable.

In FIG. 5, voltage variations C1 to C3, which are applied to non-selected cells during selective writing operation for the cell array shown in FIGS. 2 and 3, are shown. C1 is a voltage variation of non-selected cells along the selected bit line and selected word line during "0" data writing shown in FIG. 2; C2 is a voltage variation of non-selected cells along the selected bit line and selected word line during "1" data writing shown in FIG. 3; and C3 is a voltage variation of non-selected cells along the selected bit line and selected word line in such cases that during a "1" writing operation for a cell as shown in FIG. 3, "0" writing is performed for another cell as shown in FIG. 2.

Such the cases are not used in the above-described write operation. It is required that these voltage variations C1 to C3 are insufficient to break data of the non-selected cells. Therefore, it is necessary for selecting the values of $V_H$, $V_{HH}$, $V_L$ and $V_{LL}$ in such a condition that the voltage variations do not cause the Zener diodes of the non-selected cells to be forward-biased to turn on, or do not cause those breakdown in the backward-bias direction.

Figure 6:
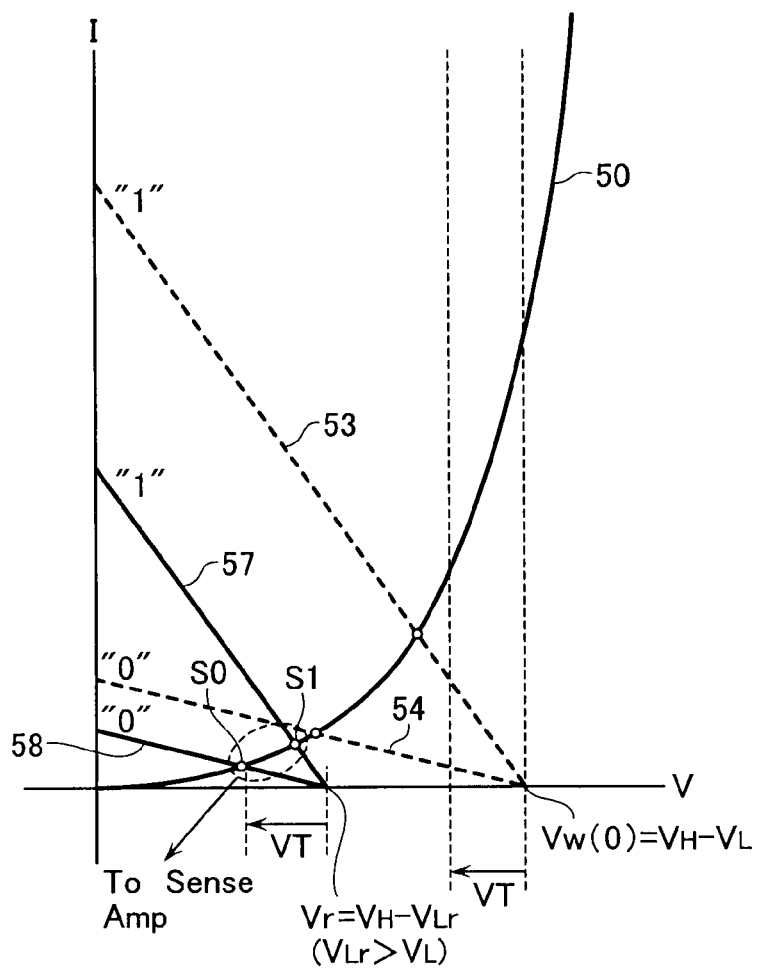
FIG. 6 shows a cell characteristic for explaining a read principle.

FIG. 6 shows a characteristic of read operation which is performed by use of the first quadrant, with the "0" write characteristic (shown by broken lines). Since it is necessary to preform read operations with a low voltage necessary for preventing the cells from erroneous write, the read operations in accordance with this embodiment are performed in the first quadrant as similar to "0" write. For example, in a read mode, the high level voltage $V_H$ is applied to a selected word line, and a low level voltage VLr, which is higher than $V_L$, is applied to a selected bit line. At this time, detect a current difference or a voltage difference between crossing points S0 and S1 of the forward-biased characteristic curve 50 of the Zener diode and the load lines 58, 57 of "0", "1" data by a sense amplifier, and read data may be determined.

In the above-described read operation, it is required to prevent the cell from erroneous write due to the read voltage application. As shown in FIG. 6, as far as that the voltage applied to the programmable resistance is set at lower than the threshold value VT in the "1" data read operation, no erroneous writes occur. In FIG. 6, in the "0" data read operation, a voltage slightly higher than the threshold value VT is applied to the programmable resistance. However, this becomes a "0" write mode. That is, a "0" read operation becomes as it is a "0" rewrite operation, thereby having nothing to do with erroneous write.

As previously described, it is possible to use the first quadrant for "1" data writing in principle. However, in such the case, a "0" read operation becomes a weak "1" write mode. To avoid such the mode, it is preferable to use the first quadrant for "0" write operations.

As described above, in the read scheme of FIG. 6, as far as that the crossing point S1 for "1" data reading is in the voltage range between Vr and Vr−VT, no erroneous writes occur. In other words, it is possible to set the read voltage Vr without considering the crossing point S0 for "0" data reading. Therefore, a sense margin and a sense speed may be improved. Supposing that the third quadrant is used for data read operation, since Zener voltage Vz is approximately constant, it is difficult to obtain a sense margin necessary for preventing the erroneous write.

As above-explained, in this embodiment, Zener diode is used as an access element for applying voltages to the programmable resistance in opposite polarities, whereby the forward bias characteristic and the backward bias breakdown characteristic thereof may be used. In the backward bias characteristic, there is a voltage region, in which a resistance value is regarded as being approximately infinite, under Zener voltage Vz.

This is an important characteristic required for the access element of the programmable resistance. In general, it is required of the access element to have such an off-state resistance value in a certain voltage range that is ten times or more as high as that in a select state.

In consideration of this, it should be appreciated that other access elements, for example, a PN junction diode, a Shottky diode and the like, may be used as far as that they are held in a high-resistive off-state in a certain voltage range.

So far, the configuration of the basic cell array and the principle of the data read/write operation have been explained. In this embodiment, a three-dimensional cell array structure in which a plurality of cell arrays are stacked above a semiconductor substrate is utilized. Such a three dimensional cell array will be explained below.

Figure 7:
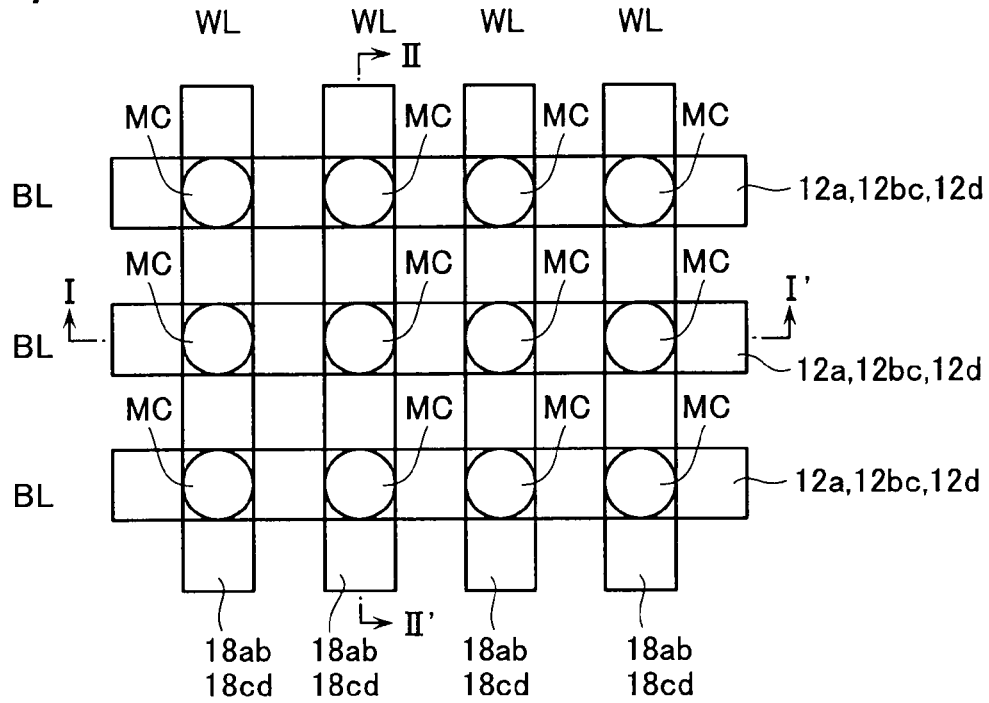
FIG. 7 shows a layout of a three-dimensional cell array according to the embodiment.
Figure 8:
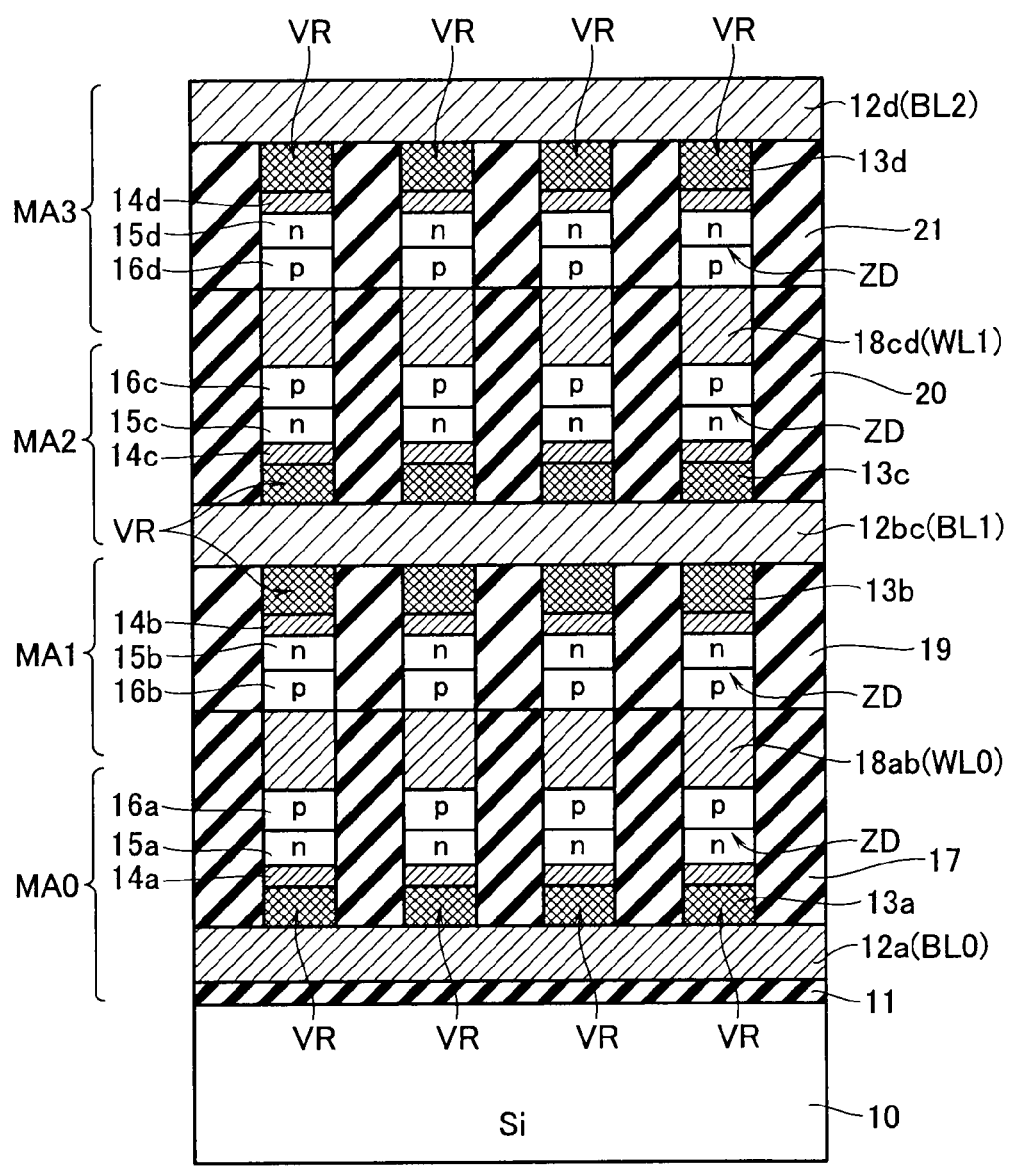
FIG. 8 is a sectional diagram as taken along line I-I' of the three-dimensional cell array shown in FIG. 7.

FIGS. 7 and 8 shows a layout and a cross section along I-I' line thereof of a three-dimensional (3D) cell array including four-layer stacked cell arrays MA0 to MA3. In these figures, the same reference numerals are used at the same parts or components in the respective cell arrays, which numerals are distinguished between the cell arrays by addition of suffixes "a", "b", "c" and "d" thereto, and also distinguished between the shared portions of each two cell arrays by addition of suffixes "ab", "bc" and "cd".

A silicon substrate 10 is covered with an insulator film such as a silicon dioxide film. Above the substrate, a plurality of bit lines (BL) 12a are arranged in parallel with each other. Pillar-type memory cells MC are arranged on each bit line 12a at a certain pitch, each of which has a variable resistance element VR and a Zener diode ZD stacked thereon. Word lines (WL) 18ab are formed to commonly connect the upper ends of the memory cells MC in a direction perpendicular to the bit lines 12a, whereby first cell array MA0 is formed.

As above-described, the variable resistance element VR is written into a "0" state by applying a high level voltage to the word line WL and a low level voltage to the bit line BL to cause it to be forward-biased. Therefore, the variable resistance element VR is disposed with such a polarity that anode and cathode thereof are to be connected to the word line WL and bit line BL, respectively. This is the same for every cell arrays stacked.

In detail, the memory cells MC are formed by patterning laminated layers having variable resistance element layer 13a, an ohmic electrode 14a, an n+-type silicon layer 15a and a p+-type silicon layer 16a. The variable resistance element layer 13a is, as shown in FIG. 1, formed of an ion conductor containing a specified metal or a polymer sandwiched by anode and cathode electrodes. An interlayer dielectric film 17 is buried around the memory cells MC to planarize the cell array MA0.

Second cell array MA1 is formed to share the word lines (WL0) 18ab with the first cell array MA0. In detail, pillar-type memory cells MC are arranged on each word line 18ab at a certain pitch, each of which is formed by patterning the laminated films of an p+-type silicon film 16b, an n+-type silicon film 15b, an ohmic electrode 14b and a variable resistance element film 13b to have a stacked structure of a Zener diode ZD and a variable resistance element VR. The cell layout is the same as that of the first cell array MA0. Bit lines (BL1) 12ab are patterned to commonly connect the variable resistance element layers 13b arranged along a direction perpendicular to the word lines 18ab. An interlayer dielectric film 19 is buried around the memory cells MC to planarize the cell array MA1.

The stacked structure of third and fourth cell arrays MA2 and MA3 is periodically formed as similar to the first and second cell arrays MA0 and MA1. Bit lines (BL1) 12bc are shared with the second cell array MA1 and the third cell array MA2. The third cell array MA2 and the fourth cell array MA3 shares the word lines (WL1) 18cd with each other. Bit lines (BL0) 12a of the lowest cell array MA0 and bit lines (BL3) 12d of the uppermost cell array MA3 are independently prepared, respectively. Although the cross section along II-II' line of FIG. 7 is not shown, the memory cells MC are disposed on the continuously formed word lines WL at the same pitch as on the bit lines on this cross section.

As shown in FIG. 7, the bit lines BL and word lines WL of each cell array are formed with such a pattern that these are rotated by 90° each other, and memory cells MC are sandwiched therebetween at the respective crossing points.

For example, the word lines WL and bit lines BL are formed with a line/space=1F/1F, where F is the minimum device feature size, thereby achieving the unit cell area of 4F2. In order to form such the structure, it is possible to use in the patterning process of the memory cells MC two exposures with an exposure mask used for patterning the word lines or the bit lines. In detail, in the lithography process for the laminated layers used for memory cells, exposures are performed at twice with an exposure mask in such a manner that the mask is rotated by 90° between the respective exposure steps. Then, etch the laminated layers so as to remain overlap portions at the two exposure steps, and it is able to dispose the memory cells MC at the respective crossing portions of the bit lines BL and the word lines WL.

Figure 9:
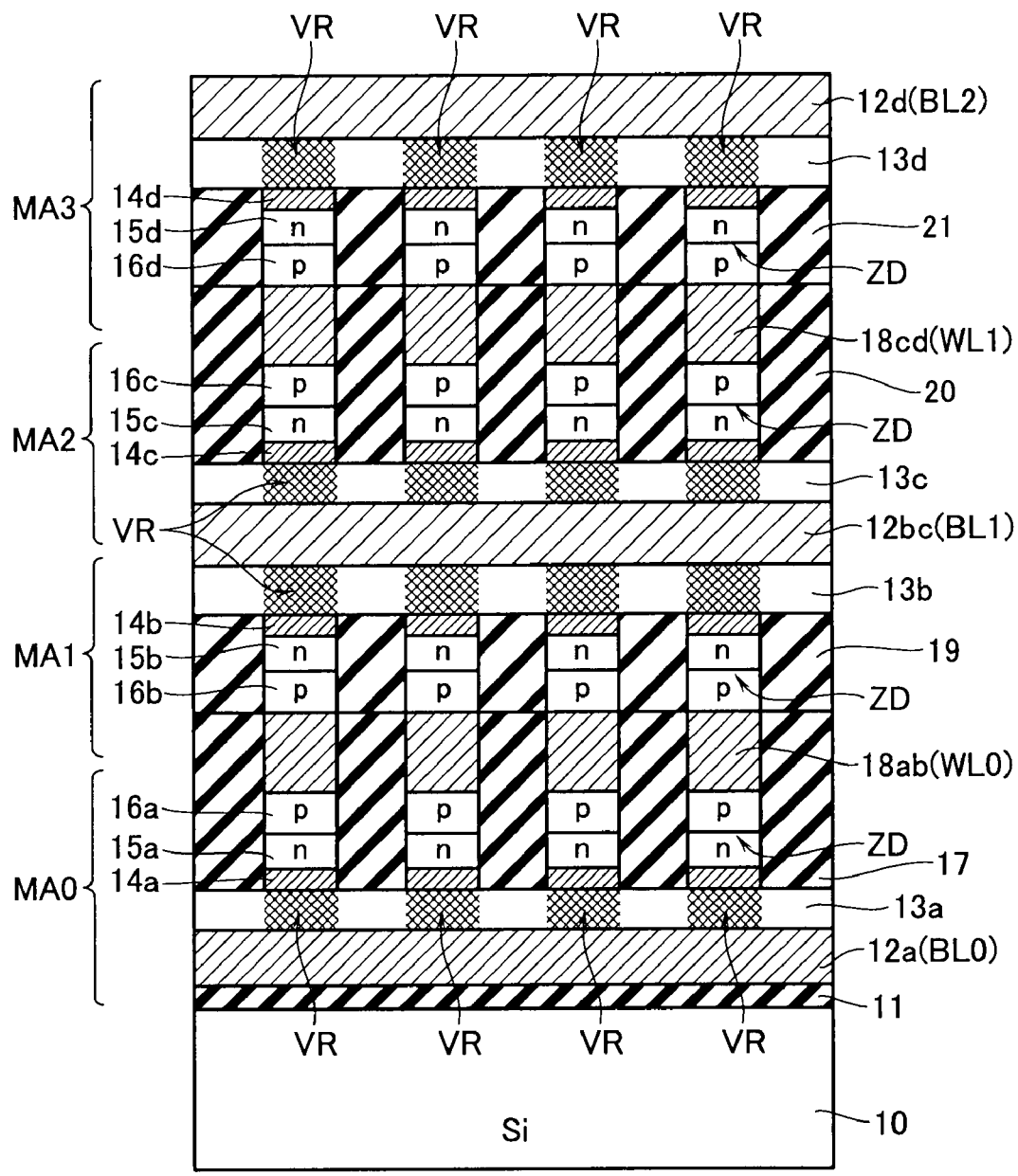
FIG. 9 is a sectional diagram of another three-dimensional cell array.

In FIG. 8, the variable resistance element layers 13 are disposed only at the cross portions of the bit lines BL and the word lines WL. In contrast to this, in such a case that the leak current of the variable resistance element layer 13 is negligible small, the variable resistance element layer 13 may be remained without patterning, as shown in FIG. 9. In this case, the sandwiched portions between the diode ZD and the bit lines or the word lines within the variable resistance element layer 13 materially function as the variable resistance elements VR.

Figure 10:
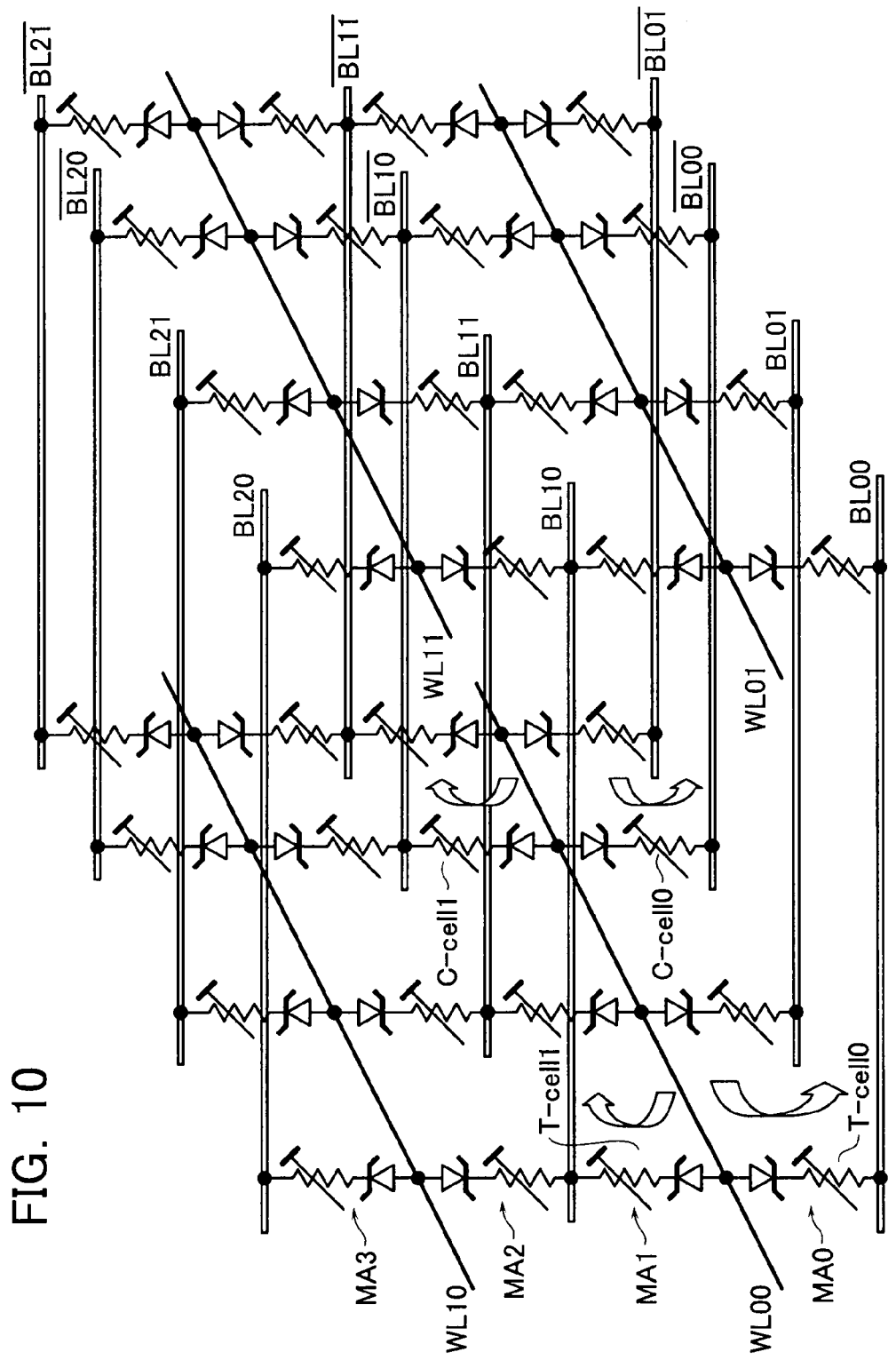
FIG. 10 shows an equivalent circuit of the three-dimensional cell array.

FIG. 10 shows a three-dimensional equivalent circuit of the 3D cell array formed as above-described. In order to prevent the bit lines from mutual interference, each two bit lines constitute a pair, and another bit line is disposed between the pair of bit lines. BL00, /BL00, BL01, /BL01, are bit line pairs of the first cell array MA0; BL10, /BL10, BL11, /BL11, . . . are shared bit line pairs between the second and third cell array MA1 and MA2; and BL20, /BL20, BL21, /BL21, . . . are shared bit line pairs between the third and fourth cell array MA2 and MA3. Further, WL0 (WL00, WL01, . . . ) are shared word lines between the first and second cell arrays MA0 and MA1; and WL1 (WL10, WL11, . . . ) are shared word lines between the third and fourth cell arrays MA2 and MA3.

In the above-described 3D cell array in which many memory cells are integrated, variation of cell characteristics gets into trouble. In detail, since the resistance value of the variable resistance element VR is determined by dendrite growth and retraction thereof, it is varied due to a history thereof, environment and the like.

Figure 11:
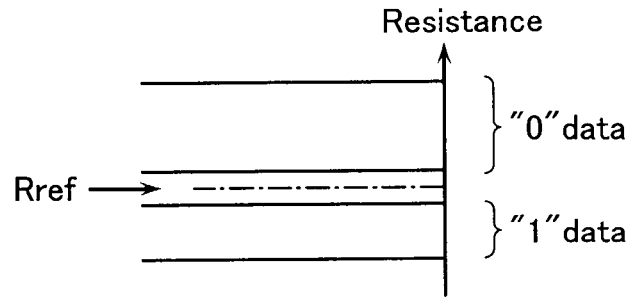
FIG. 11 shows a resistance distribution of memory cells.
Figure 12:
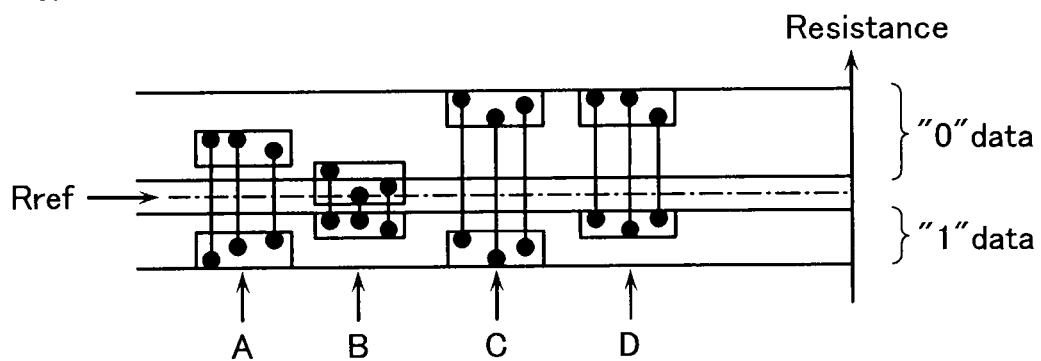
FIG. 12 shows a resistance distribution of the three-dimensional cell array according to the embodiment.

FIG. 11 schematically shows a distribution of the resistance values of data "0", "1". If there is no overlap region, as shown in FIG. 11, between the resistance values of "0" and "1", it is able to distinguish between "0" and "1" by use of a reference resistance Rref. However, in the 3D cell array that has numerous cells, it becomes difficult to set such the reference resistance Rref. FIG. 12 schematically shows such a situation as above-described. Groups A, B, C and D include nearly disposed plural cells, respectively.

Give attention to each the group, and it is able to set a reference resistance Rref. However, with respect to the entire of cell array, it becomes difficult or impossible.

In consideration of the above-described view points, in this embodiment, nearly disposed two cells constitute a pair cell for storing complementary data therein in such a manner that data "0" is stored in one cell and data "1" is stored in the other cell. Read operation is done by detecting the difference between cell currents of the two cells constituting a pair. By use of this scheme, even if there is a partial overlap between the high resistive state distribution and the low resistive distribution in the entire 3D cell array, it is possible to precisely read/write the cell data.

In FIG. 10, two cell pairs are typically shown as follows: two cells connected to a pair of bit lines BL00 and /BL00, respectively, with sharing a word line WL00 in the cell array MA0, being constituted to one pair cell, one of which is a true cell "T-cell0" and the other is a complementary cell "C-cell0"; and two cells connected to a pair of bit lines BL10 and /BL10, respectively, with sharing a word line WL10 in the cell array MA1, being constituted to another pair cell, one of which is a true cell T-cell and the other is a complementary cell C-cell. In every pairs of cells, a positive logic value of a binary data is stored in the true cell, and a negative logic value is stored in the complementary cell. Similar pair cells are selected in the cell arrays MA2 and MA3, too. In FIG. 10, cell currents at the respective read selection times are shown by arrows.

Figure 13:
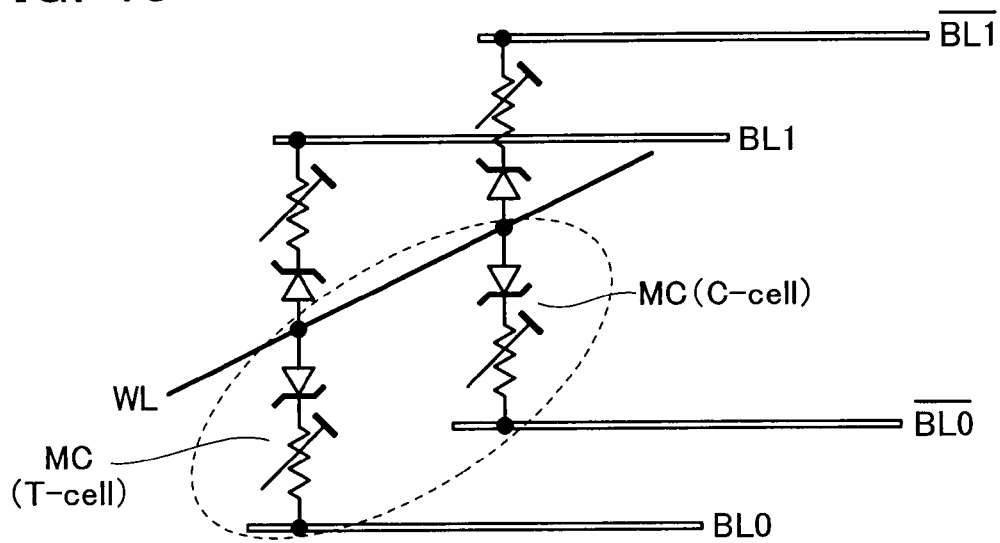
FIG. 13 shows a pair cell configuration method according to the embodiment.
Figure 14:
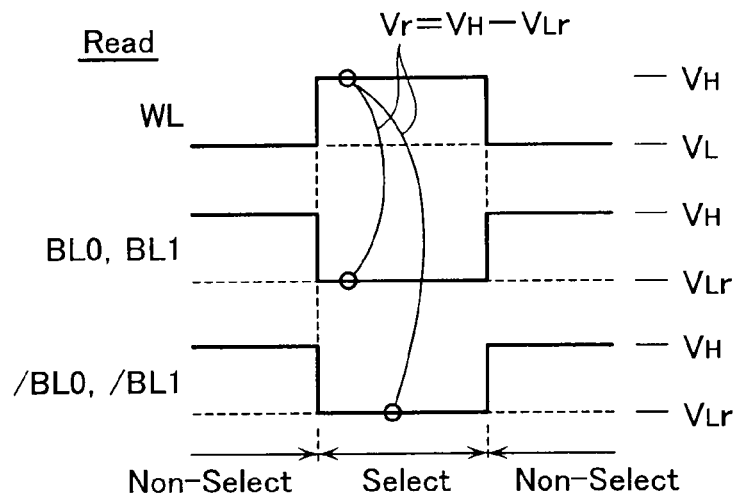
FIG. 14 is a diagram showing operational wave forms for explanation of data read according to the embodiment.

Data read/write methods in such the case that two memory cells constitute a pair cell will be described in detail bellow. FIG. 13 shows two pair cells in two cell arrays disposed adjacent up and down to have a shared word line WL. Data read operations for these two pair cells may be simultaneously performed by use of operation waveforms as shown in FIG. 14. In a non-select mode, $V_H$–$V_L$ between the bit lines and the word lines is a hold voltage which holds the memory cells in such a non-select state that diodes thereof are backward-biased to be in a high resistive off-state.

In a read selection mode as shown in FIG. 14, a high level voltage $V_H$ is applied to the word line WL which is held at a low level voltage $V_L$ in a non-select time. At the same time, a low level voltage VLr (>$V_L$) is applied to the bit lines BL0, /BL0, BL1 and /BL1 which are held at high level voltage $V_H$ in the non-select time. In other words, between the selected word line WL and the selected bit line pairs BL0, /BL0 and BL1, /BL1, a read voltage Vr=$V_H$–VLr is applied to forward-bias the selected cells. As a result, cell currents flow in the respective cells as above-explained with FIG. 6. Detect the cell current differences between the pair of bit lines BL0, /BL0, and between the pair of bit lines BL1, /BL1 by sense amps, and cell data of the respective pair cells may be determined. Since each pair cell is constituted by neighbouring two cells to store complementary data, it is possible to precisely sense the cell data.

Next, data write operations into pair cells will be described. Although a pair of cells store a data "0" in one cell and a data "1" in the other cell, "0" and "1" write voltages applied between the word line and the bit line have to be opposite each other as above-described. This means that it is impossible to simultaneously write data into the true cell, T-cell, and the complementary cell, C-cell, which share a word line. Therefore, it is required to perform data write operations for a pair cell at twice.

Figure 15:
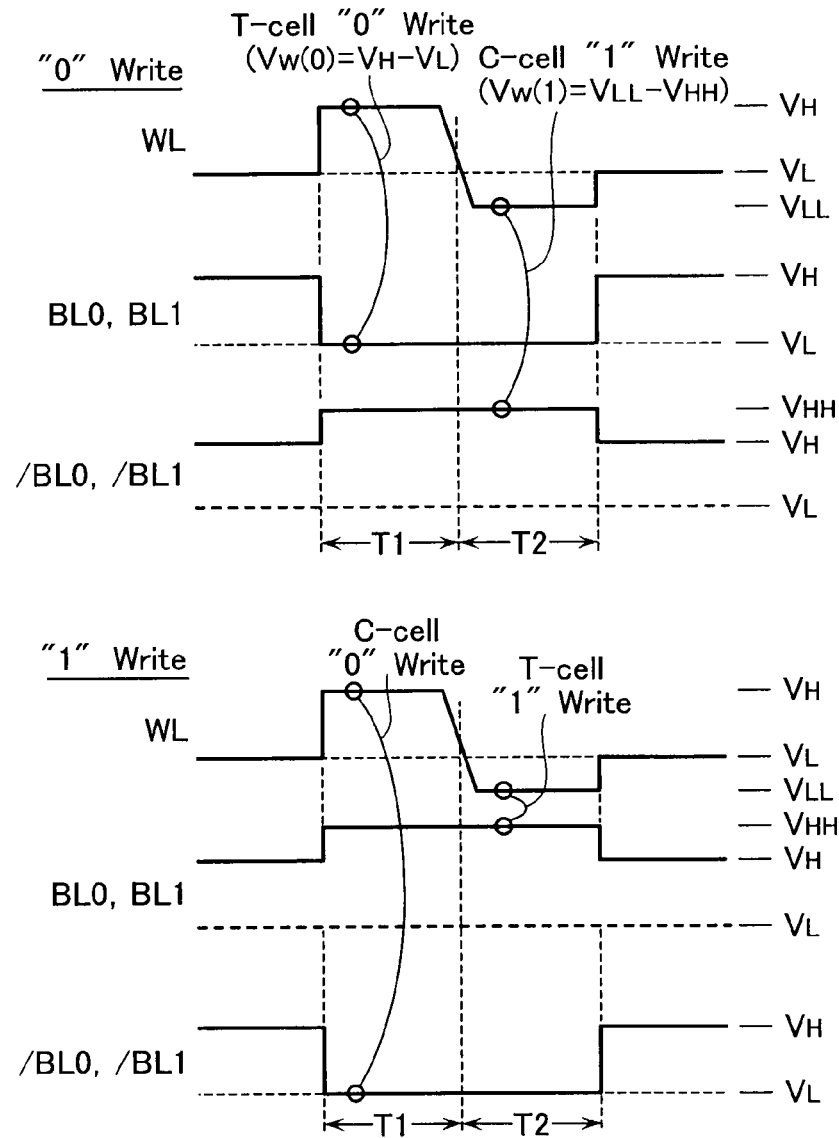
FIG. 15 is a diagram showing operation wave forms for explanation of data write according to the embodiment.

FIG. 15 shows waveforms of "0" data writing (i.e., T-cell="0", C-cell="1") and "1" data writing (i.e., T-cell="1", C-cell="0") into a pair cell. In order to write "0" data, with respect to the bit lines which are held at the high level voltage $V_H$ in the non-select mode, a low level pulse voltage $V_L$ is applied to one of bit line pair, BL0 (or BL1), and a high level pulse voltage $V_{HH}$ higher than $V_H$ is applied to the other, /BL0 (or /BL1). A high level voltage $V_H$ is applied to the word line WL in the former half T1 of the above-described bit line selection period, and a low level voltage $V_{LL}$ lower than $V_L$ is applied to the same in the latter half T2.

As a result, in the former half T1, "0" write voltage, Vw(0)=$V_H$–$V_L$, is applied to one cell, T-cell, of the pair cell to forward-bias the diode thereof due to the high level voltage $V_H$ of the word line WL and the low level voltage $V_L$ of the bit line BL0 (or BL1), whereby T-cell is written into a "0" data state. At this time, the voltage applied to the other cell, C-cell, is $V_H$–$V_{HH}$. Since the diode of C-cell is held at an off-state in this condition, no error data are written into C-cell. In the latter half T2, "1" write voltage, Vw(1)=$V_{LL}$–$V_{HH}$, is applied to the other cell, C-cell, of the pair cell to cause the diode thereof breakdown due to the low level voltage $V_{LL}$ of the word line WL and the high level voltage $V_{HH}$ of the bit line /BL0 (or /BL1), whereby C-cell is written into a "1" data state. At this time, the voltage applied to the cell T-cell, in which a data has been written, is $V_{LL}$–$V_L$. Since the diode of T-cell is held at an off-state in this condition, no error data are written into T-cell.

In order to write "1" data, pull up one of bit line pair, BL0 (or BL1), to the higher level voltage $V_{HH}$ from the high level voltage $V_H$, and pull down the other, /BL0 (or /BL1), to the low level voltage $V_L$ from the high level voltage $V_H$. And, as similar to the "0" write mode, the high level voltage $V_H$ is applied to the word line WL in the former half T1 of the above-described bit line selection period, and the low level voltage $V_{LL}$ is applied to the same in the latter half T2.

As a result, in the former half T1, one of the pair cell, C-cell, is written into a "0" data state because of that diode thereof is forward-biased due to the high level voltage $V_H$ of the word line WL and the low level voltage $V_L$ of the bit line BL0 (or BL1). In the latter half T2, the other cell, T-cell, is written into a "1" data state because of that the low level voltage VLL of the word line WL and the high level voltage $V_{HH}$ of the bit line /BL0 (or /BL1) cause diode thereof breakdown. No erroneous writes occur in both of the former half for "0" writing and the latter half for "1" writing, as similar to the above-described "0" writing mode.

As apparent from FIG. 15, "0", "1" writing into a pair cell may be selected by reversing the voltages applied to the bit line pair, while the same voltage is applied to the word line. Therefore, it is able to perform simultaneous data writing into two pairs of cells with a shared word line.

Figure 16:
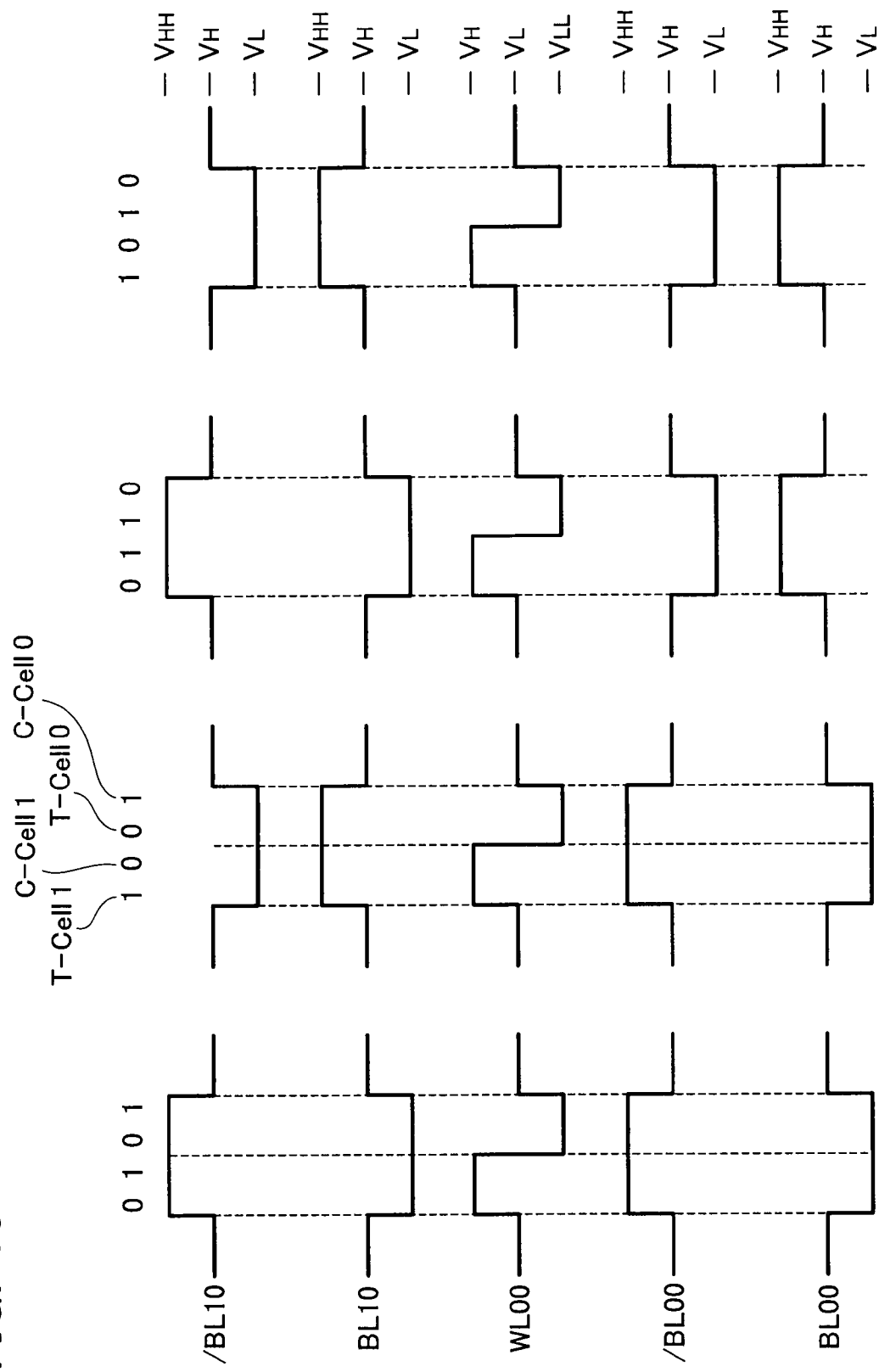
FIG. 16 a diagram showing operation wave forms for explanation of data write for two pair cell in adjacent two cell arrays.

FIG. 16 shows in detail waveforms of simultaneous data writing into two pair cells, (T-cell0, C-cell0) and (T-cell1, C-cell1), which are neighbouring up and down with a shared word line WL00. The data combinations of the two pair cells are expresses as four values "00", "01", "10" and "11".

Corresponding to the four values data, in FIG. 16, bit data of T-cell1, C-cell1, T-cell0 and C-cell0 are shown at upsides of the respective waveforms. To the respective bit line pairs, (BL00, /BL00), (BL10, /BL10), the high level voltage $V_{HH}$ and the low level voltage $V_L$ are applied in correspondence with to-be-written data. The voltages applied to the word line WL00 are changed all the same for the four data such that the high level voltage $V_H$ and the low level voltage $V_L$ are applied in the former half and the latter half respectively in the bit line selection period, as similar to that in FIG. 15. By use of such waveforms, two pair cells may be simultaneously written.

As apparent from the above-described write operations, it should be appreciated that it is possible to simultaneously access to the respective plural pair cells within the first and second cell arrays MA0 and MA1 with shared word lines. Similarly, it is possible to simultaneously access to the respective plural pair cells within the third and fourth cell arrays MA2 and MA3 with shared word lines.

In contrast to this, note that it is not allowed to simultaneously access to the second and third cell arrays MA1 and MA2 with shared bit lines.

Up to the present, it has been explained such a pair cell configuration that laterally neighbouring two memory cells constitute a pair cell in each cell array layer in the three-dimensional cell array. However, the pair cell configuration method is not limited this.

Figure 17:
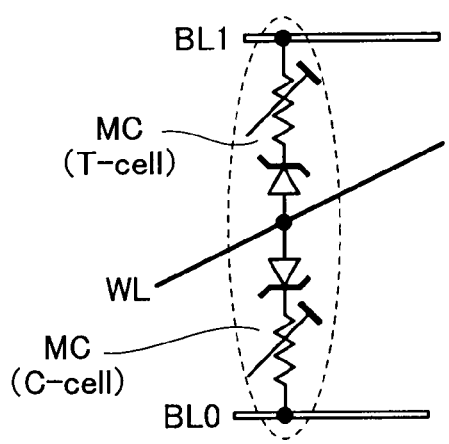
FIG. 17 shows another pair cell configuration method.

As shown in FIG. 17, it is possible to select vertically neighbouring two memory cells MC with a shared word line WL so as to constitute a pair cell (i.e., a true cell, T-cell, and a complementary cell, C-cell). In this case, the bit lines BL0, BL1 which belong to different cell arrays becomes a pair of bit lines to be connected to the pair cell.

Figure 18:
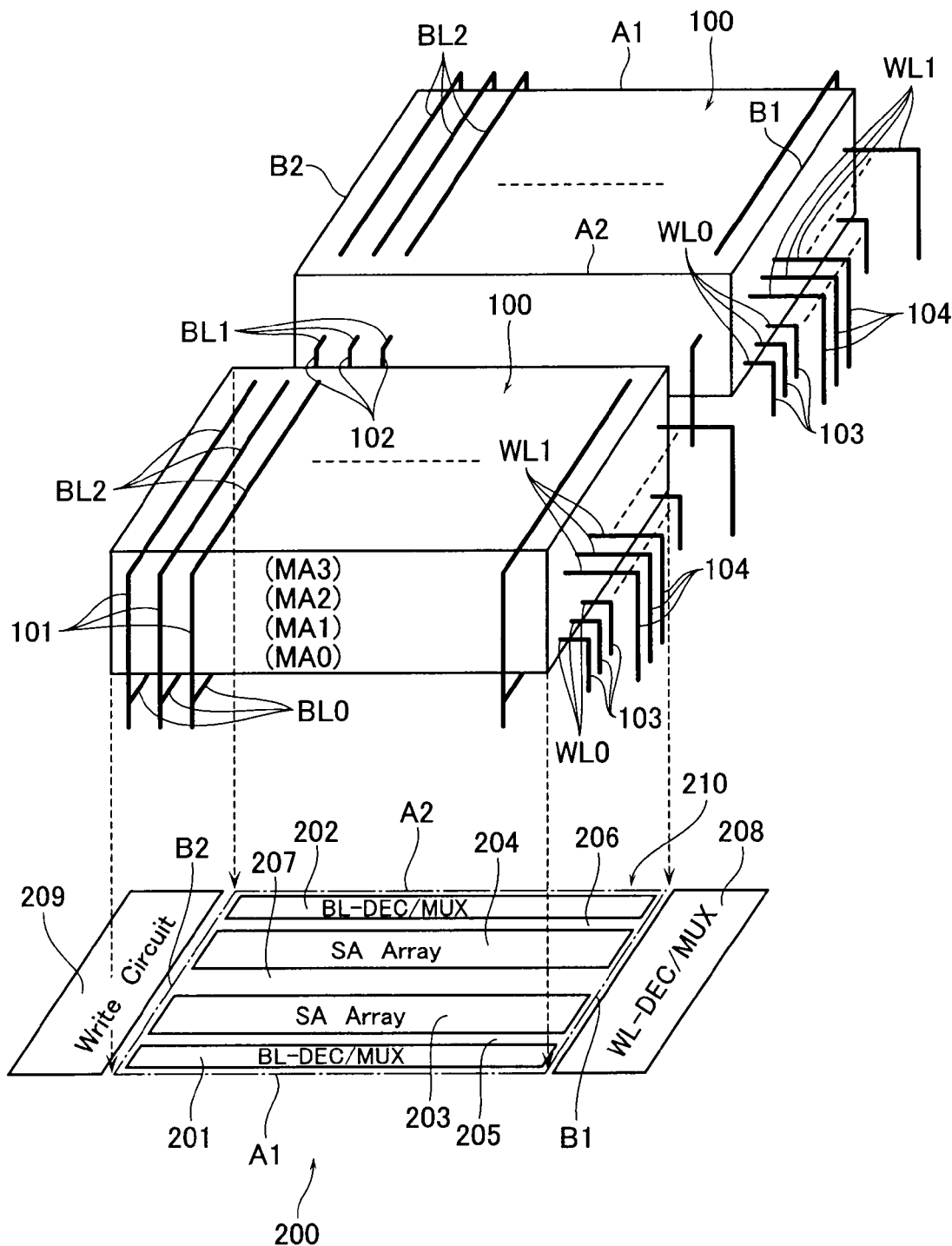
FIG. 18 is a perspective view showing a stack structure of the three-dimensional cell array and a read/write circuit thereof according to the embodiment.

FIG. 18 is a schematic perspective view showing a stacking state of cell blocks 100 and a read/write circuit 200 and interconnection relationships therebetween. Each the cell block 100 corresponds to the above-described 3D cell array with four layers.

A 3D cell array is, when necessary, divided into a plurality of cell blocks 100 with a predetermined capacity. In FIG. 18, two cell blocks 100 are arranged in a direction along the bit lines.

As shown in FIG. 18, the read/write circuit 200, which is used for data reading and writing in communication with the cell block 100, is underlain the cell block 100. The read/write circuit 200 is formed in such a state that main portion thereof is disposed within a rectangular cell layout region 210 defined on the substrate 10, above which the cell block 100 is stacked. The cell layout region 210 is defined by two boundaries A1 and A2 in the direction of the bit lines, and by two boundaries B1 and B2 in the direction of the word lines.

A group of bit lines BL0 of the first cell array MA0 and a group of bit lines BL2 of the fourth cell array MA3 are drawn to the first boundary A1 side to be connected to a bit line select circuit 201, which is disposed along the boundary A1 in the read/write circuit 200, through vertical wirings (i.e., passages that vertically run to the substrate) 101 that are disposed along the boundary A1. A group of bit lines BL1 shared by the second and third cell arrays MA1 and MA2 are drawn to the second boundary A2 side to be connected to another bit line select circuit 202, which is disposed along the boundary A2 in the read/write circuit 200, through vertical wirings 102 that are disposed along the second boundary A2.

The reason why the bit lines BL0 and BL2 are drawn to the same side to be commonly connected to the bit line select circuit 201 through the vertical wirings 101 is in such a fact that these groups of bit lines are not simultaneously activated. In detail, cell arrays MA0 and MA1 are simultaneously activated because of these have shared word lines WL0.

As similar to this, cell arrays MA2 and MA3 are simultaneously activated because of these have shared the word lines WL1. However, since the cell arrays MA1 and MA2 share the bit lines BL1, the lower cell arrays (MA1, MA2) and the upper cell arrays (MA2, MA3) are not activated simultaneously. The bit line select circuit 201, 202 include bit line decoders/multiplexers (BL-DEC/MUX).

The word lines WL0 and WL1 are drawn to the third boundary B1 side to be connected to word line select circuit 208, which is disposed along the boundary B1 in the read/write circuit 200, through vertical wirings 103 and 104, respectively, that are disposed along the boundary B1. The word line select circuit 208 has word line decoders/multiplexers (WL-DEC/MUX).

A central portion of the read/write circuit 200 serves as a global bus region 207, in which I/O data lines and pulse signal lines are disposed crossing this region in the direction of the word lines. Between this global bus region 207 and the bit line select circuits 201 and 202, disposed are sense amplifier arrays 203 and 204, respectively. Signal lines formed at the global bus region 207 are shared by the sense amplifier arrays 203 and 204.

The sense amplifiers in the sense amplifier arrays 203 and 204 are connected to bit line select circuits 201 and 202 through signal lines disposed at local bus regions 205 and 206, respectively. Therefore, some ones selected from the bit lines BL0 or BL2 by the bit line select circuit 201 are connected to the sense amp array 203. Similarly, some ones selected from the bit lines BL1 by the bit line select circuit 202 are connected to the sense amp array 204.

The I/O data lines and pulse signal lines disposed at the global bus region 207 are drawn to the fourth boundary B2 side of the cell layout region 210. Along this boundary B2, disposed is a write circuit (i.e., write pulse generator circuit) 209 for applying write pulse signals to selected bit lines.

As above-described referring to FIG. 18, bit lines and word lines of the cell arrays are connected to the read/write circuit 200 formed on the substrate 10 through the vertical wirings 101 to 104. Practically, these wirings 101 to 104 are formed of contact plugs buried in interlayer dielectric films formed surrounding the cell array. The structural examples of the interconnections are shown in FIGS. 19 and 20.

Figure 19:
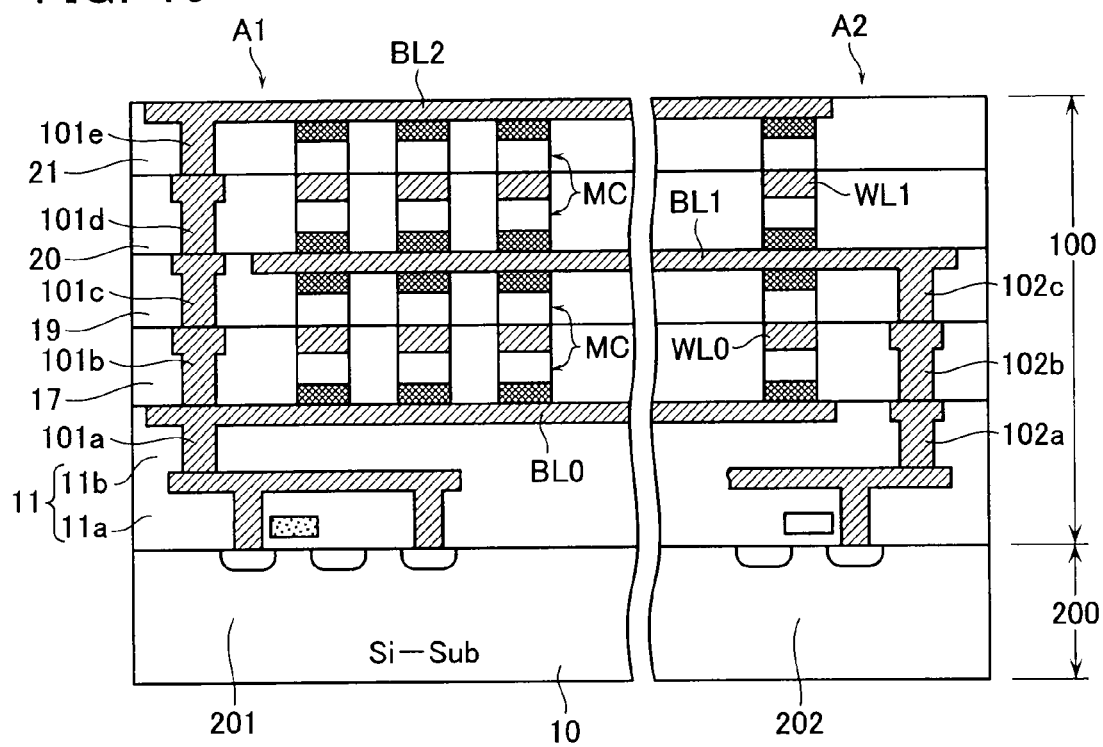
FIG. 19 is a cross-sectional diagram showing the interconnection relationship between bit lines of the cell array and the read/write circuit.

FIG. 19 shows a connection state between the bit lines and the read/write circuit 200 on a cross-section along the bit lines of the cell array. FIG. 20 shows a connection state between the word lines and the read/write circuit 200 on a cross-section along the word lines of the cell array.

Figure 20:
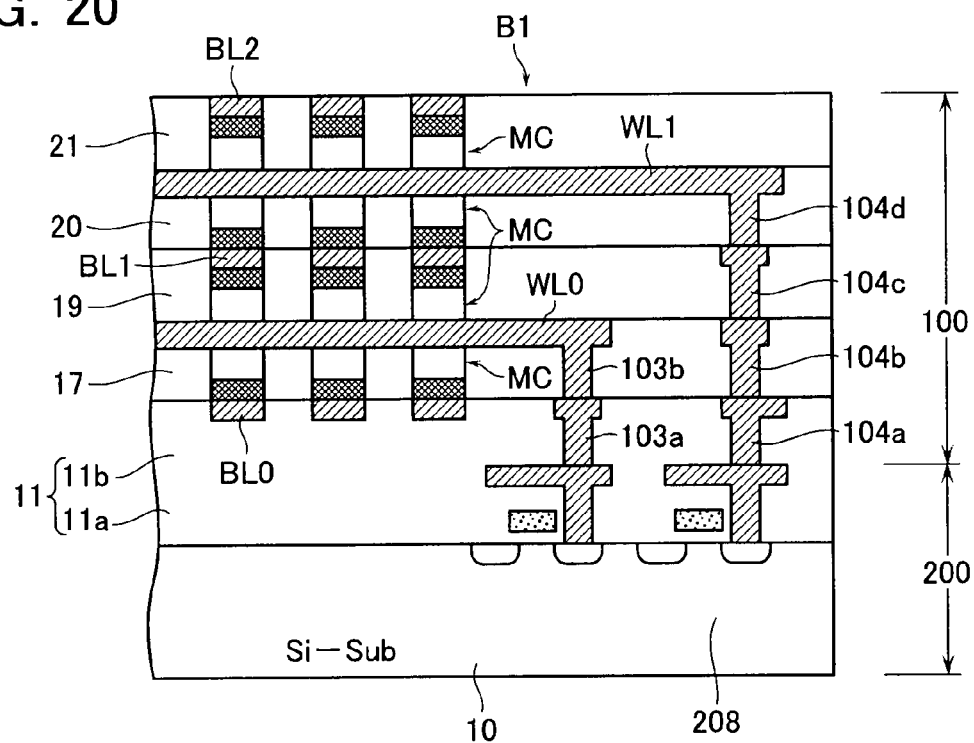
FIG. 20 is a cross-sectional diagram showing the relationship between word lines and the read/write circuit.

As shown in FIGS. 19 and 20, the read/write circuit 200 has necessary transistors and metal interconnections formed on an interlayer dielectric film 11a covering the transistors.

The read/write circuit 200 is covered by an interlayer dielectric film 11b, and the four layered cell arrays are formed thereon. Therefore, the interlayer dielectric films 11a and 11b constitute the insulator film 11 shown in FIGS. 8 and 9.

As shown in FIG. 19, the vertical wirings 101, which are used to connect the bit lines BL0, BL2 drawn toward the boundary A1 of the cell layout region 210 to the bit line select circuit 201, are composed of contact plugs 101a to 101e buried in the interlayer dielectric films 17, 19, 20 and 21. Similarly, the vertical wirings 102, which are used to connect the bit lines BL1 drawn toward the boundary A2 of the cell layout region to the bit line select circuit 202, are composed of contact plugs 102a to 102c buried in the interlayer dielectric films 11, 17 and 19.

As shown in FIG. 20, the vertical wirings 103, which are used to connect the word lines WL0 drawn toward the boundary B1 of the cell layout region to the word line select circuit 208, are composed of contact plugs 103a and 103b buried in the interlayer dielectric films 11 and 17. The vertical wirings 104, which are used to connect the word lines WL1 drawn toward the same side as the word lines WL0 to the word line select circuit 208, are composed of contact plugs 104a to 104d buried in the interlayer dielectric films 11, 17 and 20.

Although the lowest contact plugs 101a, 102a, 103a and 104a of the laminated cell arrays in FIGS. 19 and 20 are connected to metal wirings of the read/write circuit 200, it is possible to directly connect these to source/drain diffusion layers of transistors.

FIGS. 19 and 20 show an example in which the contact plugs are formed of metal films used for bit lines and word lines. The fabrication steps will be described later. Additionally, it is appreciated that the contact plugs may be formed of other metal films different from the bit lines and word lines or polycrystalline silicon films.

One cell block 100 shown in FIG. 18 includes, for example, 512 bit lines (BL) and 128 word lines (WL) for one cell array. As described above, two memory cells store one bit data in this embodiment. In this case, one cell block has a memory space of 256 columns (Col)×128 rows(Row). The memory capacity can be increased by increasing the number of cell blocks to be arranged. In order to achieve a high-speed access in such a large capacitive memory, it is necessary to perform parallel access for multi-bit data.

For example, in order to perform 32-bits parallel access, one cell block is to be divided into two parts in the word line direction, and into 32 parts in the bit line direction, whereby 64 cell units are obtained. As a result, each cell unit becomes to have a capacity of 32IO×4Col×4 Row×4. On the global bus region 207, data lines and pulse signal lines are disposed for 64IO data input/output.

Figure 21:
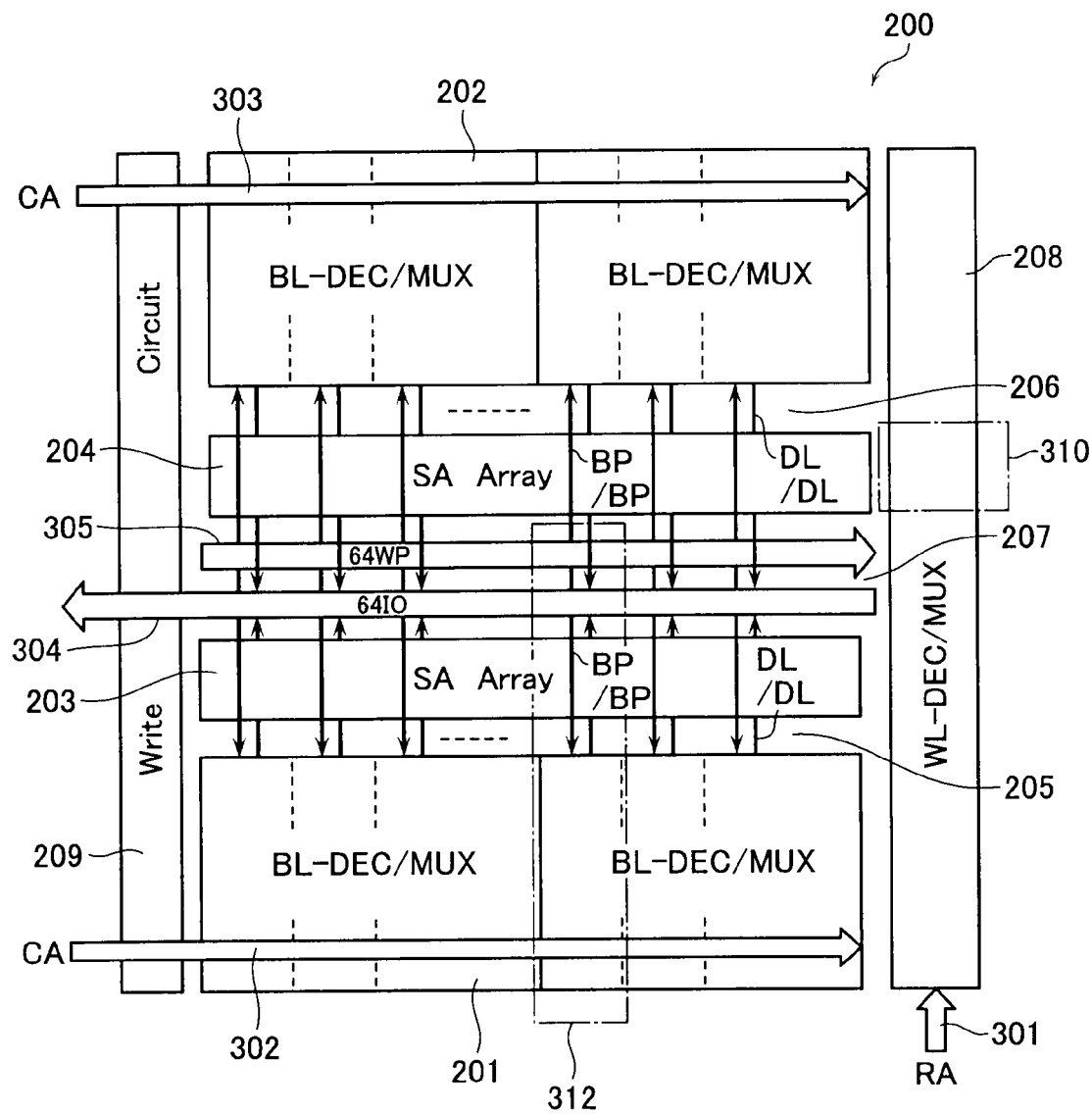
FIG. 21 is a diagram showing a layout of the read/write circuit.

FIG. 21 shows a schematic layout of the read/write circuit 200 with respect to one cell block 100 shown in FIG. 18 in a case that the above-described cell block construction is used. On the word line select circuit (WL-DEC/MUX) 208 as been disposed at the right side in FIG. 21, disposed are row address (RA) signal lines 301, which vertically run for selecting one each (i.e., upper and lower ones) from 128×2 word lines in the cell block 100.

The write circuit 209 disposed at the left side in FIG. 21 output pulse signals with high level voltage $V_{HH}$ and low level voltage $V_L$ that are supplied to selected bit lines in a write mode (see FIG. 15).

Write pulse signal lines (WP) 305 which transfer the write pulse signals are disposed as to laterally run on the global bus region 207. In parallel with the write pulse signal lines 305 on the global bus region 207, disposed are main data lines 304, on which read out data are transferred.

One cell unit is selected in one cell block, and cell data of lower two cell layers or upper two cell arrays in each cell unit are simultaneously activated. Therefore, data lines 304 are prepared for 32IO×2=64IO. The write pulse signal lines are the same.

In detail, in a read mode, read data on plural bit lines, which are respectively selected from the lower two cell arrays (MA0, MA1) or the upper two cell arrays (MA2, MA3) by the bit line select circuits 201 and 202, are simultaneously sensed by the sense amp arrays 203 and 204, and then simultaneously transferred to the data lines 304. In a write mode, write pulse signals, which are to be supplied to plural bit lines respectively selected from the lower two cell arrays (MA0, MA1) or the upper two cell arrays (MA2, MA3), are output to the write pulse signal lines 304 from the write circuit 209, and then transferred to the plural bit lines respectively selected by the bit line select circuits 201 and 202.

On the lower and upper ends of the read/write circuit 200, disposed are the bit line select circuits 201 and 202, respectively, and column address (CA) signal lines 302 and 303 are disposed to laterally run on the respective regions.

One of the bit line select circuits, i.e., circuit 201, selects 32 bit line pairs from 512 bit line pairs(=64IO×4 Col) in the upper two cell arrays, and the other selects 32 bit line pairs from 512 bit line pairs in the lower two cell arrays. Therefore, on the respective local bus regions 205 and 206, disposed are four pairs of current pass lines BP, /BP for commonly 4-columns (=8 bit lines) data as to cross the regions of sense amplifier arrays 203 and 204 for applying the pulse signals of the pulse signal lines 305 to bit lines selected by the respective bit line select circuits 201 and 202. Additionally, 64 pairs of local data lines DL, /DL for 4 columns data are disposed on the respective local bus regions 205 and 207, and these are connected to the respective sense amps in the sense amplifier arrays 203 and 204.

Figure 22:
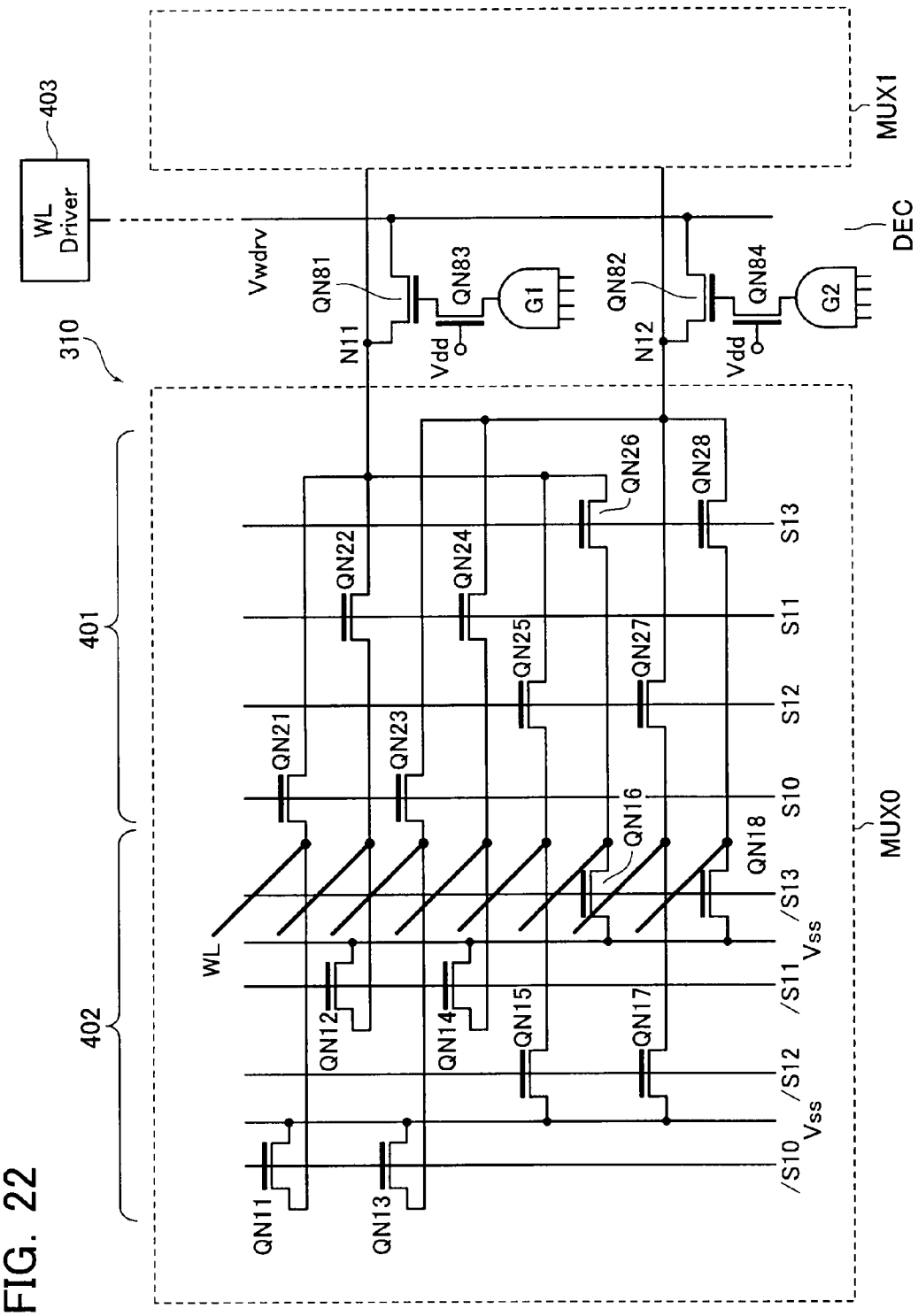
FIG. 22 is a diagram showing the word line select circuit portion of the read/write circuit.
Figure 23:
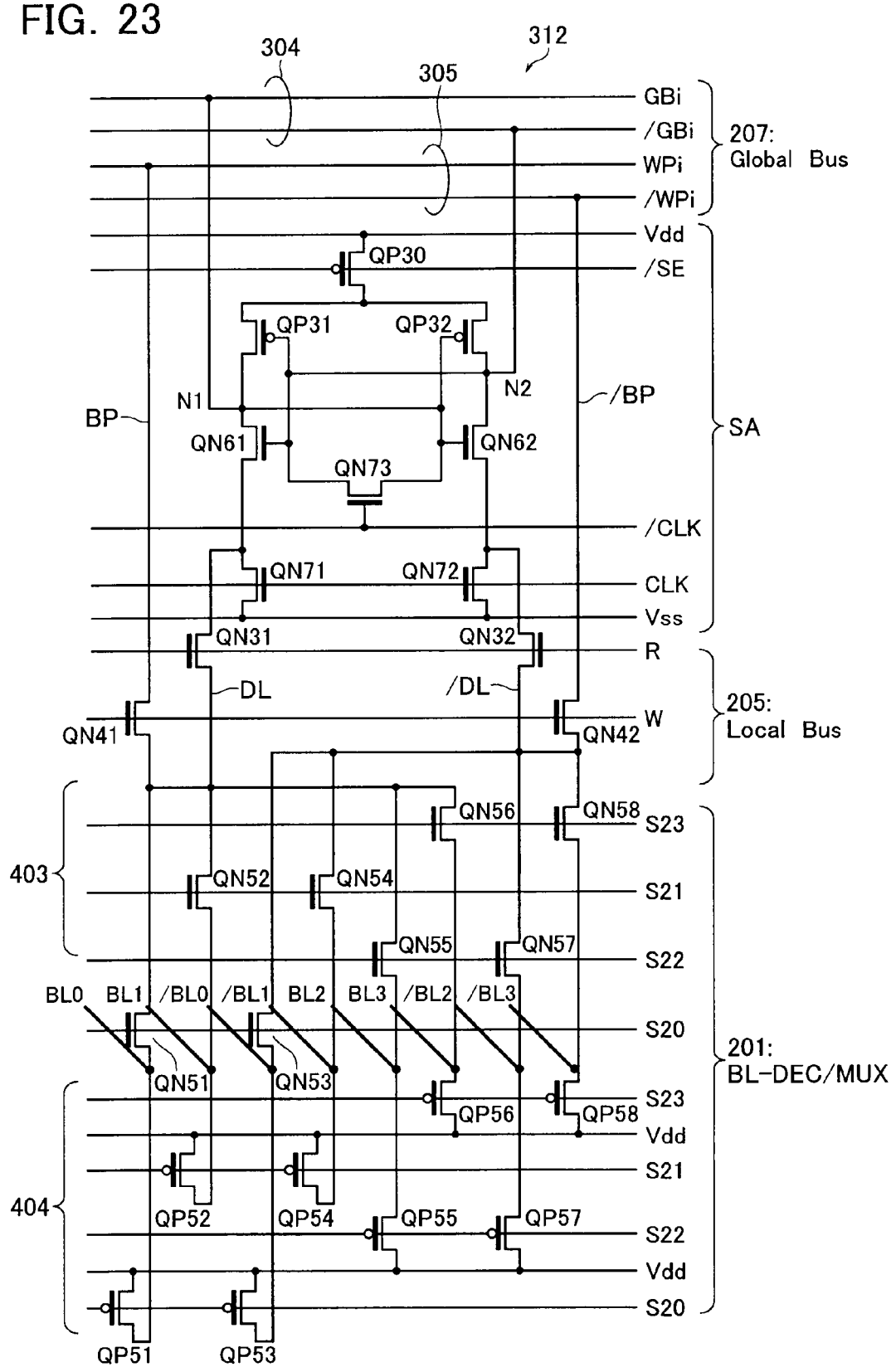
FIG. 23 is a diagram showing the bit line select circuit portion of the read/write circuit.

One circuit portion 310, that are to be connected to 4 Row×2 (=8 word lines) and another circuit portion 312, that are to be connected to 4 Col (=8 bit lines), each being surrounded by a broken line in FIG. 21, are shown in FIGS. 22 and 23, respectively, in detail.

Two multiplexers MUX0 and MUX1 have select gate circuits for selecting the lower word lines WL0 shared by the cell arrays MA0 and MA1, and the upper word lines WL1 shared by the cell arrays MA2 and MA3, respectively. Eight word lines input to the multiplexer MUX0 in FIG. 22 correspond to the word lines WL0 of the lower two cell arrays in FIG. 18.

Decoders DEC include decode gates G (G1, G2, ... ) for selecting one of 32 cell units. The multiplexer MUX0 has a select gate circuit 401 composed of NMOS transistors QN (QN21 to QN24, QN25 to QN28, ... ) that are driven by select signals S10 to S13 so as to select one from four word lines. These NMOS transistors QN21 to QN24 and QN25 to QN28 are commonly connected to nodes N11 and N12, respectively. To these nodes N11 and N12, applied is a word line drive signal Vwdrv output from a word line driver circuit 403 through self-boost transistors QN81 and QN82 which are selectively driven by the decode gates G1 and G2.

The word line drive signals Vwdrv is held at the high level voltage VH in the read mode (see FIG. 14), or at the high level voltage VH in the former half and the low level voltage VLL in the latter half in the write mode (see FIG. 15). The gates of transistors QN81, QN81 are connected to the output nodes of the decode gates G11, G12 though NMOS transistors QN83, QN84 so as to be selectively charged at a high level by the outputs of the decode gates G11, G12. The word line drive signal Vwdrv is applied to a word line WL through on-state NMOS transistors QN81, QN82.

Since the NMOS transistors QN81, QN82 are configured as transfer gates which are to be self-boosted by capacitive coupling between gates and sources therebetween, the word line drive signal Vwdrv, which are changed between VH and VLL, is transferred to the word line WL without voltage drops.

The multiplexer MUX0 has a reset circuit 402 composed of NMOS transistors QN (QN11 to QN14, QN15 to QN18, . . . ) for holding non-selected word lines as being at low level voltage VL=Vss. The multiplexer MUX1 is composed as similar to the multiplexer MUX0.

A sense amp SA shown in FIG. 23 is one of 32 sense amps in the sense amp array 205 shown in FIG. 21. Four pairs of eight bit lines BL0, /BL0 to BL3, /BL3 connected to the sense amp SA are ones selected from the bit line group BL0 or BL2 shown in FIG. 10. As previously described, since the lower two cell arrays MA0 and MA1 and the upper two cell arrays MA2 and MA3 are not activated at a time, the sense amplifier SA is commonly used for the lower cell arrays MA0, MA1 and the upper cell arrays MA2, MA3.

The sense amplifier SA is a CMOS flip-flop type current sensing amplifier with an activating PMOS transistor QP30. Two nodes N1 and N2 thereof are directly connected to a pair of ones GBi, /GBi in the global data lines 304. Drains of sensing NMOS transistors QN61 and QN62 are selectively connected to data lines DL and /DL through NMOS transistors QN31 and QN32, respectively, that are controlled by a read control signal R to turn-on during a read operation.

Except on the data read time, the nodes N1 and N2 are shorted with each other by an equalizing transistor QN73. Data lines DL, /DL are connected to a pair of bit lines selected by the bit line decoder/multiplexer BL-DEC/MUX. Drains of the sensing transistors QN61, QN62 may be selectively set at Vss or at floating states by NMOS transistors QN71, QN72 which are controlled by a clock CLK.

Based on the operations of transistors QN71, QN72, it is possible to apply the low level voltage VLr(=Vss) shown in the waveforms of FIG. 14 to selected bit lines and to perform a positive feed-back operation of the sense amp SA when cell data are transferred to NMOS transistors QN61, QN62 in a data sense time.

The bit line decoder/multiplexer BL-DEC/MUX has a select gate 403 composed of NMOS transistors QN51 to QN54, and Q55 to Q58 controlled by decoded signals S20 to S23 for selecting one pair from four pairs of bit lines to connect these to the data lines DL and /DL, respectively. Additionally, the bit line decoder/multiplexer BL-DEC/MUX has a reset circuit 404 composed of PMOS transistors QP51 to QP54, and QP55 to QP58 for holding non-selected bit lines as being at a high level of Vdd.

The pair of data lines DL, /DL are connected to a pair of signal lines WPi, /WPi in the pulse signal lines 305 through NMOS transistors QN41, QN42 that are driven by a write control signal W to turn-on, and through signal lines BP, /BP.

In the above-described configuration, when a data read operation is performed, word lines selected by select gate circuit 403 become "H", and bit line pairs selected by select gate circuit 403 become "L". At this time, cell currents from the selected complementary cells on the selected bit line pair are transferred to the drains of NMOS transistors QN61, QN62 of the sense amp SA through data lines DL, /DL and through NMOS transistors QN31, QN32. During this operation, NMOS transistors QN71, QN72 are held at an off-state.

Thereafter, clock CLK becomes "H" to turn-on the NMOS transistors QN71, QN72, whereby the drains of the sensing NMOS transistors QN61, QN62 are clamped at Vss. As a result, a differential voltage generated between the nodes N1 and N2 due to the difference of cell currents is positively feeded back to be amplified such that one of the nodes N1, N2 becomes Vdd, while the other becomes Vss. Amplified cell data as above-described is output to the main data lines GBi, /GBi.

In a data write mode, the drive signal Vwdrv, which is at the high level voltage $V_H$ in the former half and at the low level voltage $V_L$ in the latter half, is applied to a selected word line. Simultaneously, write pulse signals, which are set at combinations among $V_{HH}$, $V_H$, $V_L$ and $V_{LL}$ corresponding to-be-written data, are applied to selected pair cells through the write pulse signal lines WPi, /WPi, whereby data write operations are performed.

Since one word line is commonly connected to many pair cells, it is required for the word line to supply a large current to the pair cells. In consideration of such the current value, it is required to design drivability of the word line decoder, resistance of the word line itself, the transistor size, and the like. It should be appreciated that the word line multiplexer MUX0 for eight word lines shown in FIG. 22 and the bit line decoder/multiplexer DEC/MUX for eight bit lines shown in FIG. 23 have the same circuit configuration.

Figure 24:
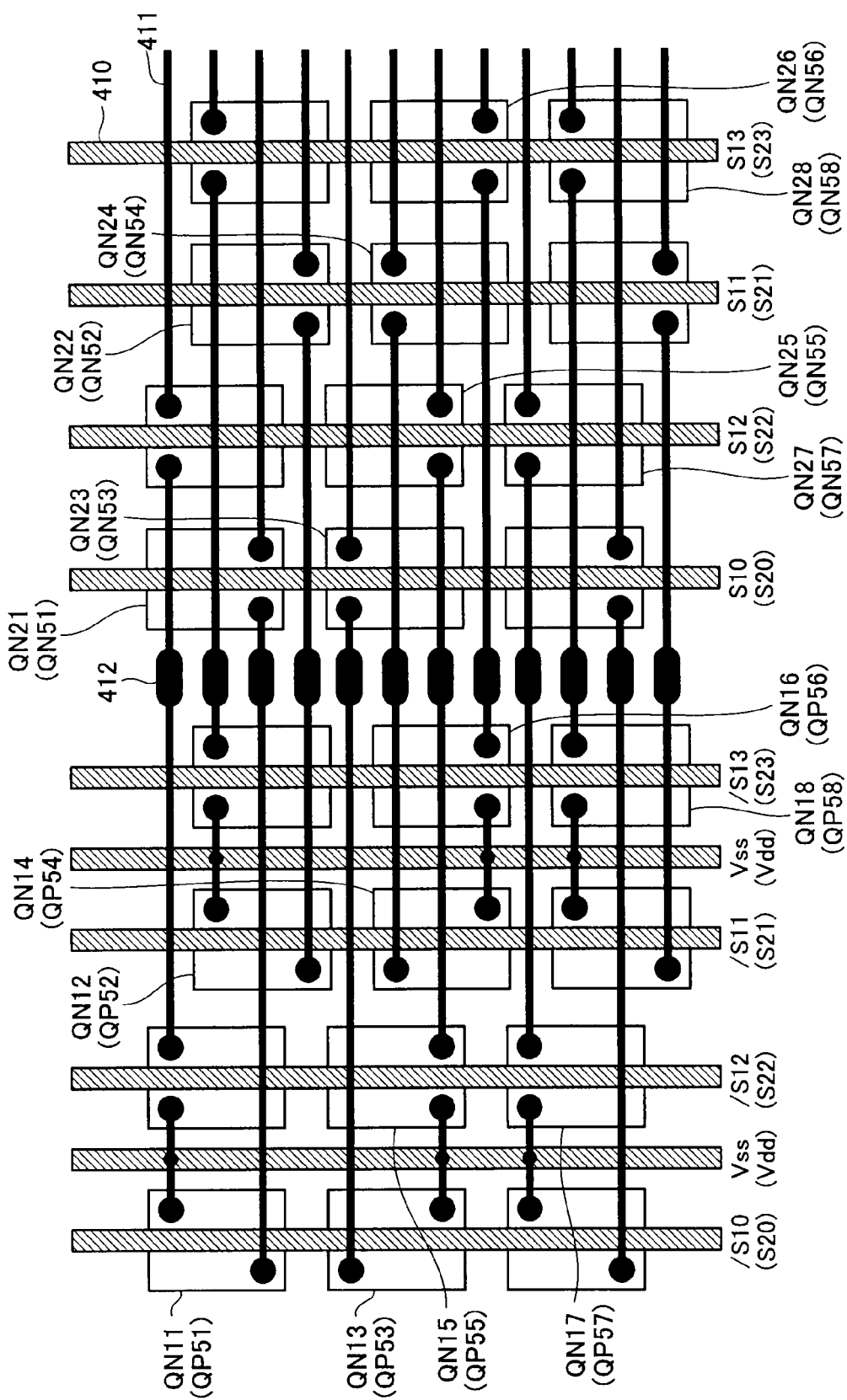
FIG. 24 shows a main portion layout of the transistor circuit shown in FIGS. 22 and 23.

Therefore, these circuit regions may be achieved to have the same layout as shown in FIG. 24. In FIG. 24, transistors QN21 to QN28, QN11 to QN18, select signals S10 to S13, /S10 to /S13 and low level power supply (Vss) lines in the circuit of FIG. 22 are shown, and in correspondence to these, transistors QN51 to QN58, QP51 to QP58, select signals S20 to S23 and high level power supply (Vdd) lines in the circuit of FIG. 12 are shown parenthesized. Although there is such a situation that the respective transistors corresponding to each other are of different conductivity-types, it is possible to use the same layout for these circuits.

Vertically running wiring 410 in FIG. 24 are gate lines of transistors that serve as select lines and power supply lines of Vdd, Vss. These may be simultaneously formed by patterning a polysilicon film. Since power supply lines Vss, Vdd are merely required to be potentially fixed as necessary for holding non-selected bit lines and word lines as being not floating, it is not required that these are not very low resistive. Therefore, it is able to use for these lines the same polysilicon film used for gate electrodes.

Although laterally running wirings 411 are shown by schematic straight lines, these are metal wirings which are contacted to sources and drains of transistors. Contact portions 412 serve as to connect the metal wirings 411 to bit lines and word lines, to which the vertical interconnection lines (i.e., contact plugs) 101 to 104 shown in FIG. 18 are connected.

Bit lines and word lines in the above-described cell array are preferably formed with a line/space of 1F/1F (F: minimum device-feature size). These bit lines and word lines are connected while holding the line pitch to the read/write circuit 200 on the substrate as shown in FIG. 18. In this case, the metal wirings 411 shown in FIG. 24 are formed to have the same line/space of 1F/1F.

In contrast to this, transistors disposed on the way of the metal wirings 411 must have a large area necessary for supplying a required current. In consideration to this view point, in FIG. 13, each transistor is formed to have a gate width of three pitches of the metal wirings 411.

When the transistor size and metal wire pitch are determined as above-described, in order to effectively dispose the transistors, the select signal lines (S10, /S10)(S20), (S11, /S11)(S21), (S12, /S12)(S22) and (S13, /S13)(S23) which are suffixed in accordance with an address order of 0, 1, 2 and 3 are arranged in such an order of (S10, /S10)(S20), (S12, /S12)(S22), (S11, /S11)(S21) and (S13, /S13)(S23).

As a result, between a transistor array of QN21(QN51), QN23(QN53) selected by the select signal line S10(S20) and a transistor array of QN23(QN52), QN24(QN54) selected by the select signal line S11(S21), disposed is a transistor array of QN25(QN55), QN27(QN57) selected by the select signal line S12(S22). By employing such the transistor arrangement, it is possible to dispose transistors with a large size within a metal wiring area in which wirings are arranged at a small pitch without idle spaces.

Next, referring to FIGS. 25 to 27, it will be explained that the bit lines, word lines and contact portions thereof to the read/write circuit 200 are simultaneously formed by use of a dual damascene method.

Figure 25:
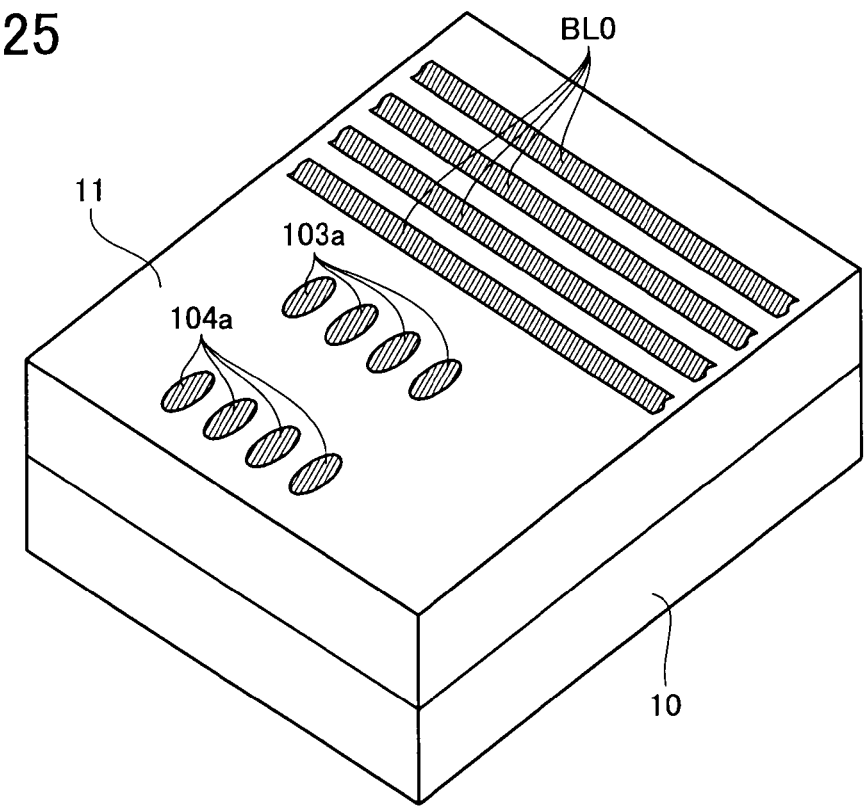
FIG. 25 is a perspective view of the cell array state after the bit line formation.

FIG. 25 shows such a state that bit lines BL0 are formed on the interlayer dielectric film 11 covering the substrate 10 on which the read/write circuit 200 has been formed. Simultaneous with the formation of these bit lines BL0, formed are contact plugs 103a, 104a by a dual damascene process. These are used for connecting the word lines WL0, WL1 to be stacked thereon to the read/write circuit 200. Although not shown in FIG. 25, other contact plugs for connecting end portions of the bit lines BL0 to the read/write circuit 200 are formed simultaneously with the contact plugs 103a, 104a.

Figure 26:
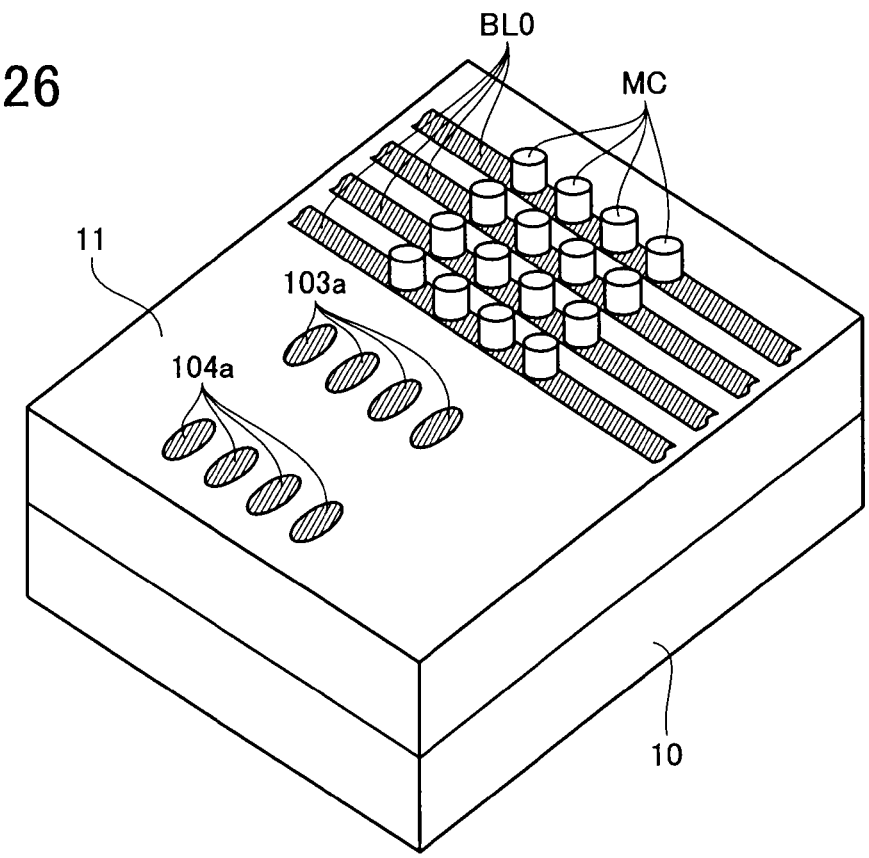
FIG. 26 is a perspective view of the cell array state after the memory cell formation on the bit lines.
Figure 27:
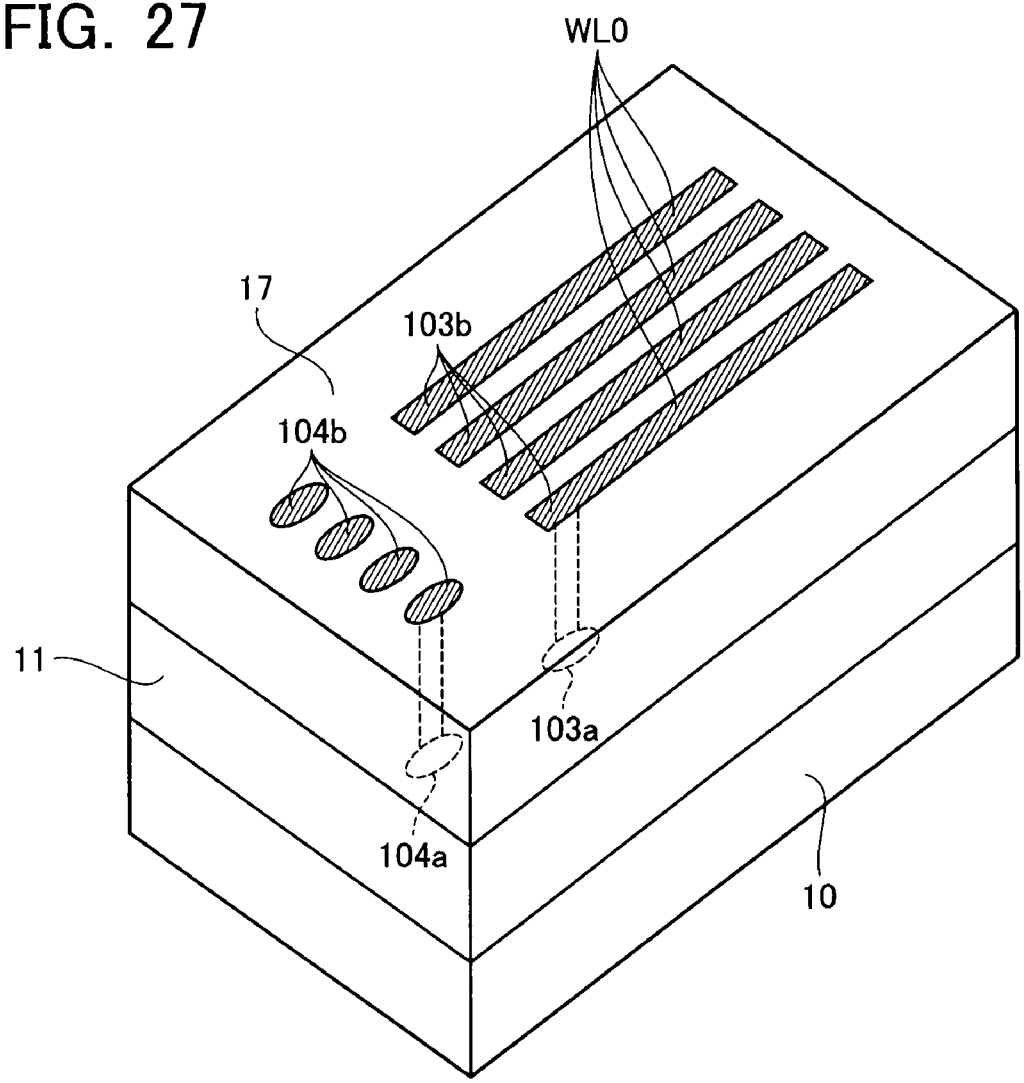
FIG. 27 is a perspective view of the cell array state after the word line formation.

Then, as shown in FIG. 26, memory cells, each of which is constituted by a variable resistance element and a diode stacked each other, are formed on the bit lines BL0 at a predetermined pitch. Next, as shown in FIG. 27, interlayer dielectric film 17 is deposited to cover the memory cells MC, and then word lines WL0 are formed on the film 17 by a dual damascene process. In this process, contact plugs 103b and 104b, which are to be connected to the contact plugs 103a and word lines WL1 to be formed next, respectively, are buried.

Figure 28A:
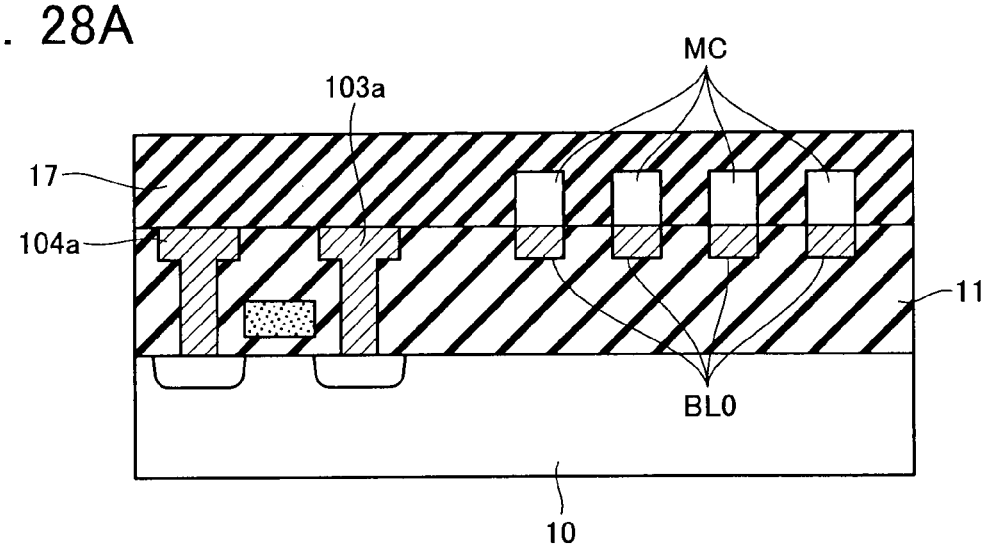
FIGS. 28A to 28C are cross-sectional views showing the word line forming process.
Figure 28B:
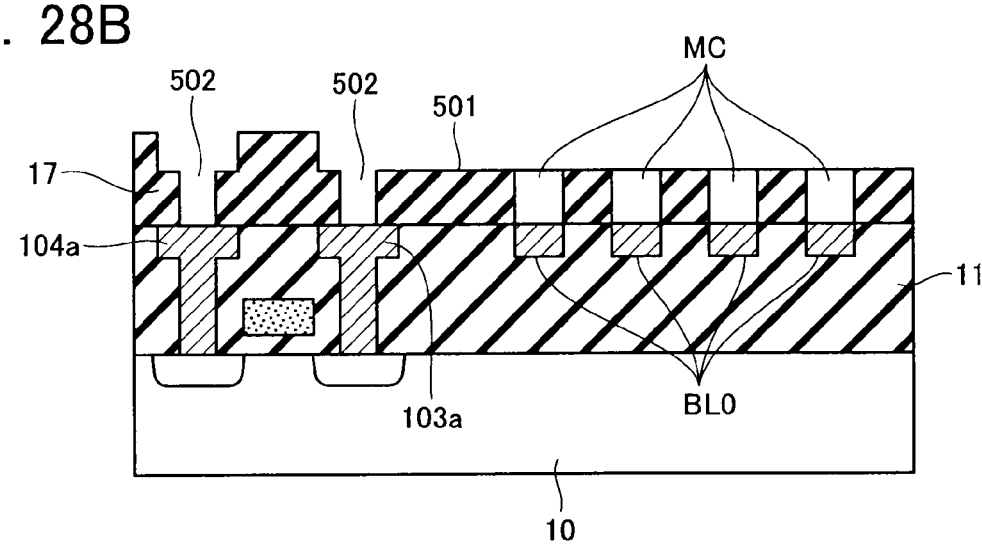
Figure 28C:
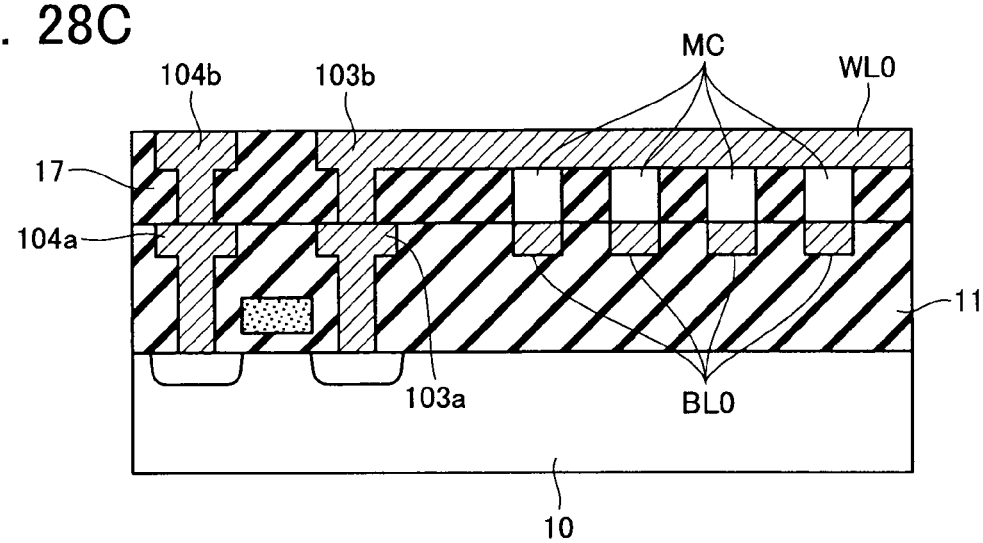

FIGS. 28A to 28C show the burying process of the word lines WL0 and contact plugs 103b, 104b in detail in a cross sectional view along the word line WL0 direction. FIG. 28A shows such a state that the interlayer dielectric film 17 is deposited to cover the memory cells MC and then planarized.

Thereafter, as shown in FIG. 28B, wiring-burying trenches 501 are formed in the interlayer dielectric film 17 by an RIE (Reactive Ion Etching) process for word line burying so as to expose the upper ends of the memory cells MC. Further, contact holes 502 are formed at the positions where the contact plugs 103a, 104a have been buried so as to be deeper than the trenches 501. Then, a wiring material metal layer is deposited and processed by a CMP (Chemical Mechanical Polishing) method. As a result, as shown in FIG. 28C, the word lines WL0 and the contact plugs 103b, 104b are simultaneously buried and formed.

Continuously, memory cell formations, interlayer dielectric film depositions, wiring and contact plug formations by use of the damascene method are periodically performed. By use of such processes, as shown in FIGS. 19 and 20, four-layered cell arrays may be stacked in such a manner that the bit lines and word lines of each layer is connected to the read/write circuit on the substrate.

Having described the embodiments of the present invention, other embodiments and variations will be apparent to those skilled in the art. Therefore, the invention should not be viewed as limited to the disclosed embodiments but rather should be viewed as limited only by the spirit and scope of the appended claims.

Additional Embodiment

Another embodiment will be explained below. The memory device according to an additional embodiment explained below is a resistance change memory, which stores a high resistance state and a low resistance state as information data as similar to the above-described programmable resistance memory, and is referred to as a phase change memory in a wide sense. Therefore, the description in the above-described embodiment with reference to FIGS. 1 to 28C may be effective as it is in the embodiment described below with the exception of the recording layer's material and recording mechanism explained with reference to FIG. 1.

A recording layer constituting a variable resistance element in this embodiment is formed of two, first and second, composite compound layers, which are stacked. The first compound layer contains at least two types of cation elements represented by $A_xM_yO_z$ while the second compound layer has at least one transition element and has a cavity site capable of housing a cation moved from the first compound layer.

Explaining in detail, the first compound layer is a transition metal oxide expressed by $A_xM_yO_4$, which has, for example, a spinel structure or a delafossite structure.

In this compound $A_xM_yO_4$, "A" is at least one element selected from the group consisting of Mg, Al, Mn, Fe, Co, Ni, and Zn; and "M" is at least one element selected from the group consisting of V, Cr, Mn, Fe, Co and Ni.

It is required of "AA" and "M" to be different from each other. Molar ratios "x" and "y" are selected to satisfy $0.1 \leq x \leq 2.2$ and $1.8 \leq y \leq 2$, respectively.

With the above-described element "A", ion radius necessary to maintain a certain crystal structure is optimized, and a sufficiently high ion conductivity may be achieved. By use of the above-described element "M", it becomes easy to control the electron state in a crystal layer.

The first compound layer may be composed of another compound (transition metal oxide) $A_xM_yO_3$, which has, for example, an ilmenite structure. In this compound $A_xM_yO_3$, "A" is at least one element selected from the group consisting of Mg, Al, Mn, Fe, Co, Ni and Zn; and "M" is at least one element selected from the group consisting of V, Cr, Mn, Fe, Co and Ni.

It is required of "A" and "M" to be different from each other. Molar ratios "x" and "y" are selected to satisfy $0.5 \leq x = \leq 1.1$ and $0.9 \leq y \leq 1$, respectively.

With the above-described element "A", ion radius necessary to maintain a certain crystal structure is optimized, and a sufficiently high ion conductivity may be achieved. By use of the above-described element "M", it becomes easy to control the electron state in a crystal layer.

Further, the first compound layer may be composed of another compound (transition metal oxide) $A_xM_yO_4$ with another crystal structure, e.g., a wolframite structure. In this compound $A_xM_yO_4$, "A" is at least one element selected from the group consisting of Mg, Al, Ga, Sb, Ti, Mn, Fe and Co; and "M" is at least one element selected from the group consisting of Cr, Mn, Mo and W.

It is required of "A" and "M" to be different from each other. Molar ratios "x" and "y" are selected to satisfy $0.5 \leq x \leq 1.1$ and $0.9 \leq y \leq 1$, respectively.

With the above-described element "A", ion radius necessary to maintain a certain crystal structure is optimized, and a sufficiently high ion conductivity may be achieved. By use of the above-described element "M", it becomes easy to control the electron state in a crystal layer.

Crystalline structures employed as the first compound layer are as follows:
  Spinel structure
  Cryptomelen structure
  Ilmenite structure
  Wolframite structure
  Marokite structure
  Hollandite structure
  Heterolite structure
  Ramsdelite structure
  Olivine structure
  Delafossite structure
  $\alpha$-NaFeO$_2$ structure
  LiMoN$_2$ structure The second compound layer is typically composed of Zn doped MnO$_2$ with a ramsdelite structure. Further, the second compound layer may be composed of one of:

i. $L_xMO_2$
where, "L" is a cavity site, in which a cation element moved from the first compound is to be housed; "M" is at least one element selected from Ti, Ge, Sn, V, Cr, Mn, Fe, Co, Ni, Nb, Ta, Mo, W, Re, Ru and Rh; and "O" is oxygen. Molar ratio "x" is selected to satisfy $1 \leq x \leq 2$.

ii. $L_xMO_3$
where, "L" is a cavity site, in which a cation element moved from the first compound is to be housed; "M" is at least one element selected from Ti, Ge, Sn, V, Cr, Mn, Fe, Co, Ni, Nb, Ta, Mo, W, Re, Ru and Rh; and "O" is oxygen. Molar ratios "x" is selected to satisfy $1 \leq x \leq 2$.

iii. $L_xMO_4$
where, "L" is a cavity site, in which a cation element moved from the first compound is to be housed; "M" is at least one element selected from Ti, Ge, Sn, V, Cr, Mn, Fe, Co, Ni, Nb, Ta, Mo, W, Re, Ru and Rh; and "O" is oxygen. Molar ratios "x" is selected to satisfy $1 \leq x \leq 2$.

iv. $L_xMPO_y$
where, "L" is a cavity site, in which a cation element moved from the first compound is to be housed; "M" is at least one element selected from Ti, Ge, Sn, V, Cr, Mn, Fe, Co, Ni, Nb, Ta, Mo, W, Re, Ru and Rh; "P" is phosphorous; and "O" is oxygen. Molar ratios "x" and "y" are selected to satisfy $0.3 \leq x \leq 3$ and $4 \leq y \leq 6$, respectively.

As the second compound layer, one of the following crystalline structures may be employed.
  Spinel structure
  Hollandite structure
  Ramsdelite structure
  Anatase structure
  Brookite structure
  Pyrolusite structure
  ReO$_3$ structure
  MoO$_3$ structure
  MoO$_{1.5}$PO$_4$ structure
  TiO$_{0.5}$PO$_4$ structure
  FePO$_4$ structure
  $\beta$MnO$_2$
  $\gamma$MnO$_2$
  $\lambda$MnO$_2$
  Perovskite structure In FIGS. 33 to 41, there are shown combination examples of elements together with circles with respect to compound examples usable in this embodiment. In addition to those shown in FIGS. 33-41, in this embodiment, a two-element system transition metal oxide selected from TiO$_x$, CuO$_x$, ZnO$_x$, NiO$_x$, MnO$_x$, FeO$_x$ and the like (where, ratio "x" is smaller than stoichiometric one) may also be employed as the second compound.

A Fermi level of electrons in the first compound is set to be lower than that in the second compound. This is one of conditions required to cause a state of the recording layer to have a reversible property. Any of Fermi levels used here is obtained as a value measured from a vacuum level.

Forming the recording layer as described above, the recording density of Pbpsi (Peta bits per square inch) class can be principally achieved, and further, low power consumption can also be achieved.

In this embodiment, preferable combinations of the first and second compounds are as follows:
  a combination of spinel type compound (AM$_2$O$_4$) as the first compound and ramsdelite type compound (A$_x$MO$_2$) as the second compound;
  a combination of Mn spinel type compound (ZnMn$_2$O$_4$) as the first compound and Ti spinel type compound (ZnTi$_2$O$_4$) as the second compound;
  a combination of Mn spinel type compound (ZnMn$_2$O$_4$) as the first compound and Al spinel type compound (ZnAl$_2$O$_4$) as the second compound;
  a combination of delafossite type compound (CuCoO$_2$) as the first compound and ilmenite type compound (CoTiO$_3$) as the second compound; and
  a combination of delafossite type compound (CuCoO$_2$) as the first compound and Ti spinel type compound (ZnTi$_2$O$_4$) as the second compound.

Figure 29:
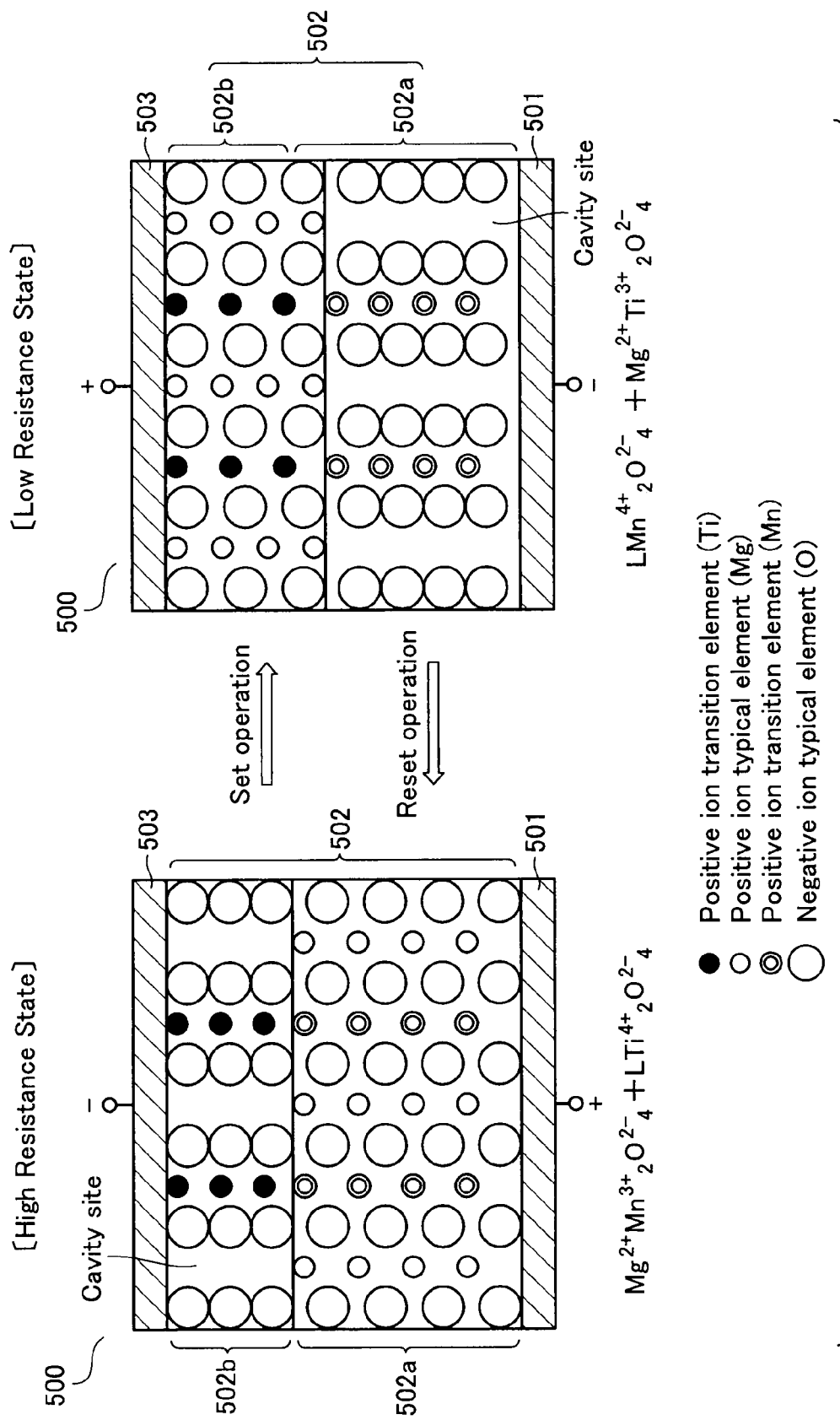
FIG. 29 is a diagram showing a variable resistance element in accordance with another embodiment.

FIG. 29 shows a variable resistance element (or unit) 500, in which a recording layer 502 has a stacked structure with a first composite compound layer 502a and a second composite compound layer 502b. Recording layer 502 is sandwiched by electrode layers 501 and 503. The upper electrode 503 serves as a protect layer.

The first compound layer 502a allocated at the side of electrode 503 has at least one type of transition element, and the second compound layer 502b allocated at the side of electrode 501 has a cavity site capable of housing a positive ion moved from the first compound layer 502a.

In an initial state (i.e., reset state), the first compound layer 502a is expressed by $A_xM_yO_z$ while the second compound layer 502b is in such a state that has a cavity site to be able to house a cation moved from the first compound layer 502a. This reset state is a high resistance state, i.e., stable state.

In a set state, the second compound layer 502b is in such a state that a cation element moved from the first compound layer 502a is housed in the cavity site. At this time, the first compound layer 502a is in a state, in which the compound is expressed by $A_{x-u}M_yO_z$ (designating that element "A" decreased by "u" in correspondence to the components moved to the second compound layer 502b).

Here, for the purpose of simplification of the following explanation, the initial state (reset state) denotes such a state that the resistance value of the recording layer 502 is high while the set state denotes such a state that the resistance value of the recording layer 502 is low.

For example, in case the second compound layer 502b is formed of Mg$^{2+}$Ti$_2$O$_4$ (or LTi$^{4+}$O$_4$) and the first compound layer 502a is formed of LMn$_2^{4+}$O$_4$ (or Mg$^{2+}$Mn$_2^{3+}$O$_4$), the resistance in the initial state (i.e., reset state) is high and that in the set state is low.

Even if a device structure is identical to another, the resistance value of the recording layer 502 changes in accordance with types of the first and second compound layers 502a and 502b, so that the resistance values of the set and reset states may be freely set according to a product.

In FIG. 29, three types of small cycles in the recording layer 502 denote cation elements (positive ion elements) while a large cycle denotes an anion element (negative ion element).

Figure 30:
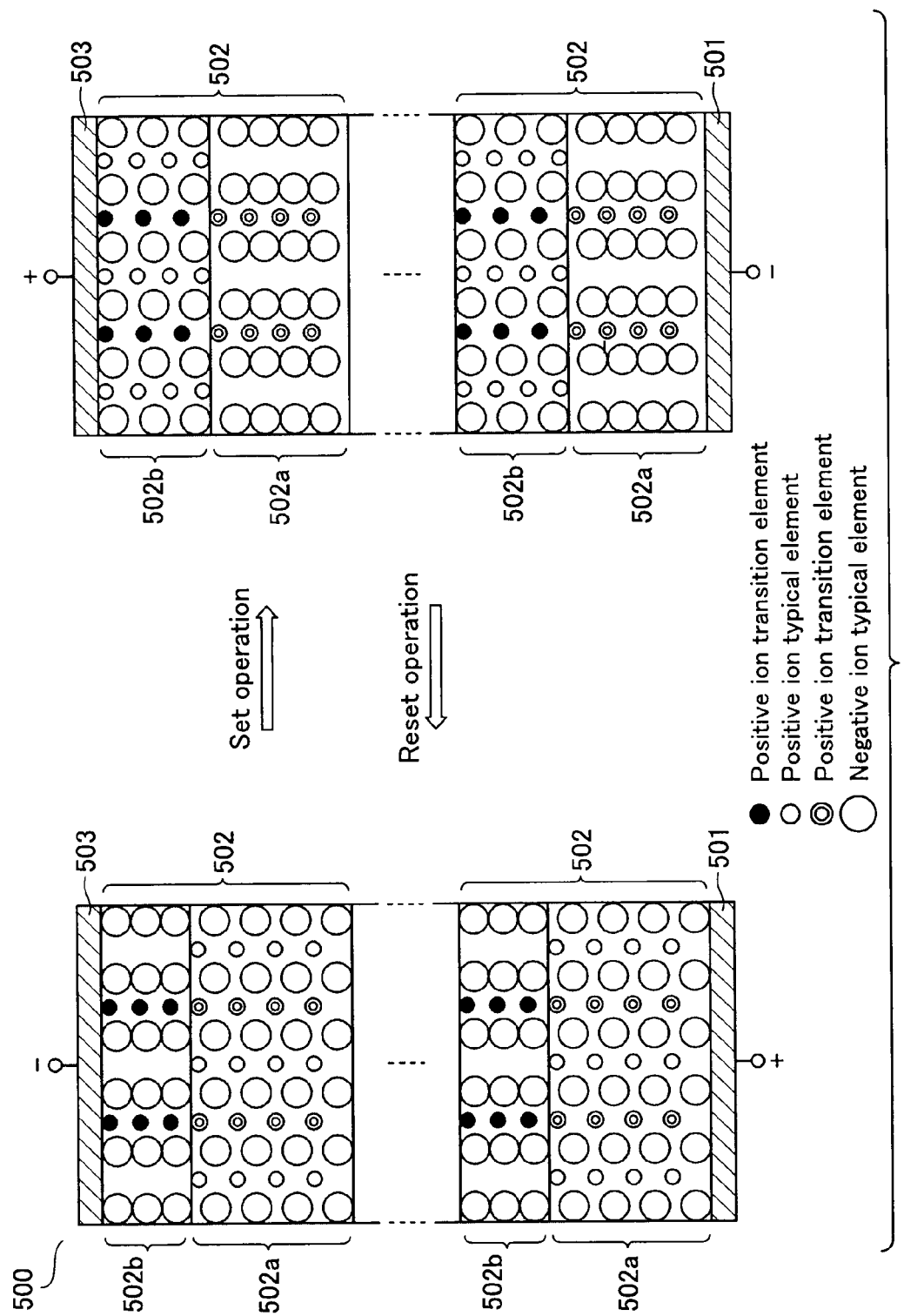
FIG. 30 shows a modified element structure.

As shown in FIG. 30, the first and second compound layers 502a and 502b constituting the recording layer 502 each may be stacked on two or more multiple layers.

In the reset state, applying a voltage to the recording layer 502 in such a manner that the electrodes 501 and 503 become cathode and anode, respectively, some of the positive ions in the first compound layer 502a move therein to be injected in part into the second compound layer 502b.

There are cavity sites in the second compound layer 502b, which are capable of housing the positive ions. Therefore, the positive ions moved from the first compound layer 502a will be housed in the cavity sites in the second compound layer 502b.

As a result, the valence of the positive ion (transition element) in the first compound layer 502a increases while that in the second compound layer 502b decreases.

Assuming that the recording layer 502 is in a high resistance state (i.e., insulator state) as the initial state (reset state), as a result of the positive ion movement as described above, the recording layer 502 is set in a low resistance state (conductive state), i.e., set state.

By contrast, in a set state, when a voltage is applied to the recording layer 502 in such a manner that the electrodes 501 and 503 become anode and cathode, respectively, some of the positive ions in the second compound layer 502b move therein to be injected in part into the first compound layer 502a.

The positive ions moved from the second compound layer 502b will be stored in the first compound layer 502a. As a result, the valence of the positive ion (transition element) in the second compound layer 502b increases while that in the first compound layer 502a decreases.

Therefore, the recording layer 502 is reset to the initial state (high resistance state, i.e., insulator state) from the low resistance state.

As described above, the set/reset operation can be controlled by an orientation of the voltage applied to the recording layer 502 (orientation of a voltage/current pulse).

The above-described "set" and "reset" are defined as: one of them is "write"; and the other is "erase".

Data defined by the high resistance state and the low resistance state may be read in such a manner as to supply a current pulse to the recording layer 502 and detect the resistance value thereof. It should be noted here that it is required of the current pulse used at a read time to be too small to cause resistance change of the recording layer 502.

The set/reset operation can also be controlled by the following method.

The reset operation can also be performed by applying a voltage to the recording layer 502, thereby carrying a large current pulse in the recording layer 502. For example, the voltage is set in a manner that electrodes 501 and 503 serve as a cathode and an anode, respectively. At this time, setting the voltage to be lower than a level, at which ions start moving, or setting the pulse width of the voltage to be smaller than a time length, in which ions start moving, joule heat is generated in the recording layer 502.

As a result, part of the positive ions move in the second compound layer 502b to be diffused and drifted into the first compound layer 502a because the cathode side is lower in electrochemical energy. And the positive ion elements moved from the second compound layer 502b to the first compound layer 502a are housed in the cavity sites therein.

Although electrons also move from the second compound layer 502b to the first compound layer 502a at this time, electron Fermi level in the first compound layer 502a is lower than that in the second compound layer 502b. Therefore, the total energy of the recording layer 502 decreases, so that the reset state naturally advances.

The recording layer becomes in a high energy state after the set operation has been completed. Therefore, Joule heat is not generated at this time, and the set state can be continuously kept as it is. This is because that a so called ion transfer resistance works.

The valence of the element "A" moved from the first compound layer 502a and housed in the second compound layer 502b is responsible for this working. The fact that this element is bivalent has a very important meaning.

If the element "AA" is a univalent element such as Li, a sufficient ion transfer resistance cannot be obtained in the set state, and positive ion elements immediately return from the second compound layer 502b to the first compound layer 502a. In other words, it becomes impossible to take a sufficiently long retention time.

Therefore, it is preferable to provide an information recording/reproducing apparatus, in which the valence of the element "AA" is bivalent.

In the meantime, after the reset operation is completed, an oxidization agent is generated on the anode side. Thus, it is preferable to employ a hardly oxidized material (for example, electrically conductive oxide) as the electrode 501.

It is preferable that electrically conductive oxide does not have ion conductivity. As an example of such oxide, the following materials can be employed. The most preferable material from the view point of comprehensive performance considering a good electric conductivity is $LaNiO_3$.

MN

In the formula, "M" is at least one element selected from the group consisting of Ti, Zr, Hf, V, Nb and Ta; and "N" is nitrogen.

$MO_x$

In the formula, "M" is at least one element selected from the group consisting of Ti, V, Cr, Mn, Fe, Co, Ni, Cu, Zr, Nb, Mo, Ru, Rh, Pd, Ag, Hf, Ta, W, Re, Ir, Os and Pt; and "O" is oxygen. The molecular ratio "x" is set to satisfy $1 \leq x \leq 4$.

$AMO_3$

In the formula, "A" is at least one element selected from the group consisting of K, Ca, Sr, Ba and Ln; "M" is at least one element selected from the group consisting of Mn, Fe, Co, Ni, Cu, Zr, Nb, Mo, Ru, Rh, Pd, Ag, Hf, Ta, Re, W, Ir, Os and Pt; and "O" is oxygen.

$A_2MO_4$

In the formula, "AA" is at least one element selected from the group consisting of K, Ca, Sr, Ba and Ln; "M" is at least one element selected from the group consisting of Ti, V, Cr, Mn, Fe, Co, Ni, Cu, Zr, Nb, Mo, Ru, Rh, Pd, Ag, Hf, Ta, W, Re, Ir, Os and Pt; and "O" is oxygen.

The reset operation may be carried out by promoting such a phenomenon that the recording layer 502 is heated, and by accelerating the movement of the positive ions element housed in the cavity site of the second compound layer 502b to the first compound layer 502a.

Specifically, the recording layer 502 can be easily changed from the row resistance state to the high resistance state by utilizing Joule-heat and its residual heat, which is generated by applying a mass current pulse to the recording layer 502.

As described above, applying the mass current pulse to the recording layer 502, the resistance value of the recording layer 502 increases, so that the reset operation is achieved.

Here, in order to achieve lower power consumption, it is important to find out material, in which ion radius and moving path of the positive ion element are satisfied to make the positive ion moving without causing a crystal destruction in the set operation.

Figure 31:
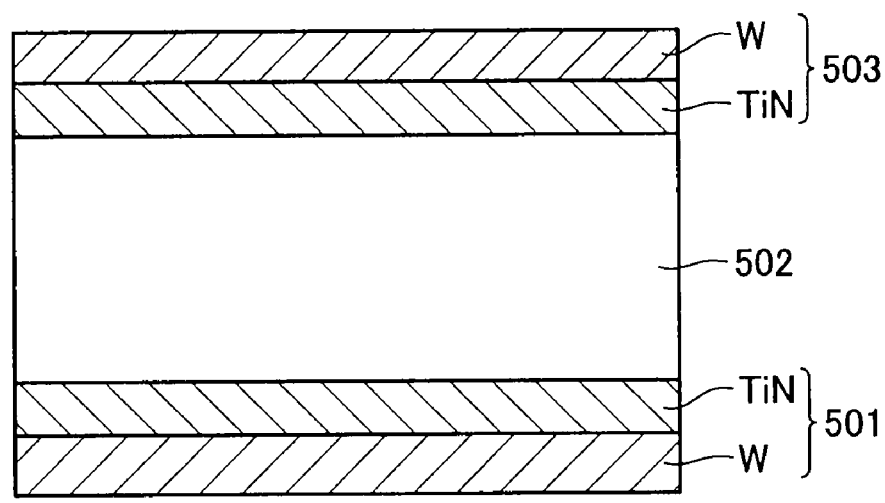
FIG. 31 shows a preferable element structure.

FIG. 31 shows a preferable electrode structure of the memory element, in which a spinel type compound is used as at least part of the recording layer. Each of electrodes 501 and 503 is formed of a W film and a TiN film interposed between the W film and the recording layer 502.

In case the recording layer 502 has a spinel structure, it is preferable to employ (110)-oriented one. The W film may be formed as (110)-oriented one by selecting the deposition condition. Sequentially depositing TiN film, recording layer, TiN film and W film on the (110) W film, it is possible to make the compound layer having a (110) spinel structure.

Figure 32A:
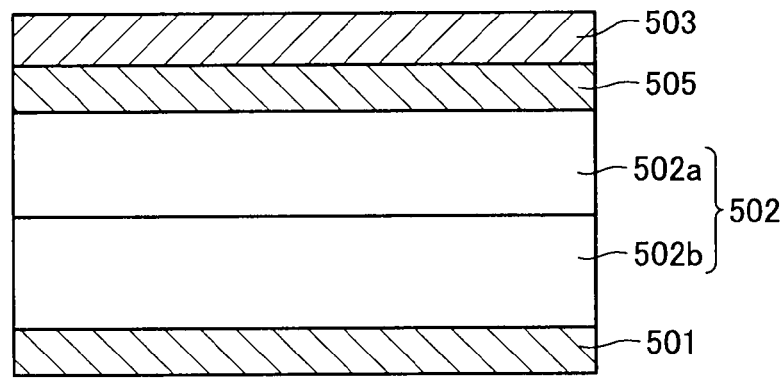
FIGS. 32A to 32C each shows an element structure with a heater(s) attached.
Figure 32B:
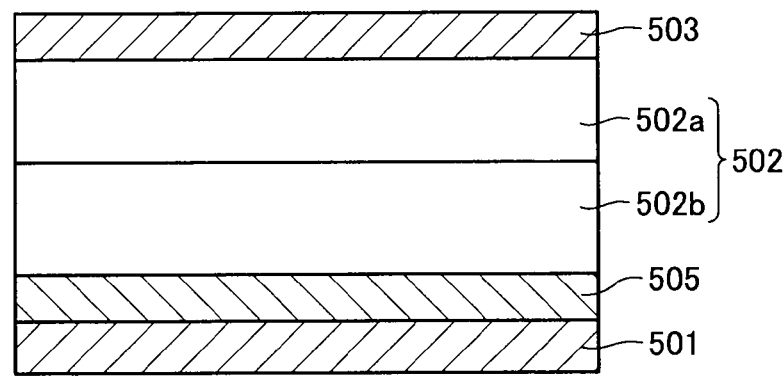
Figure 32C:
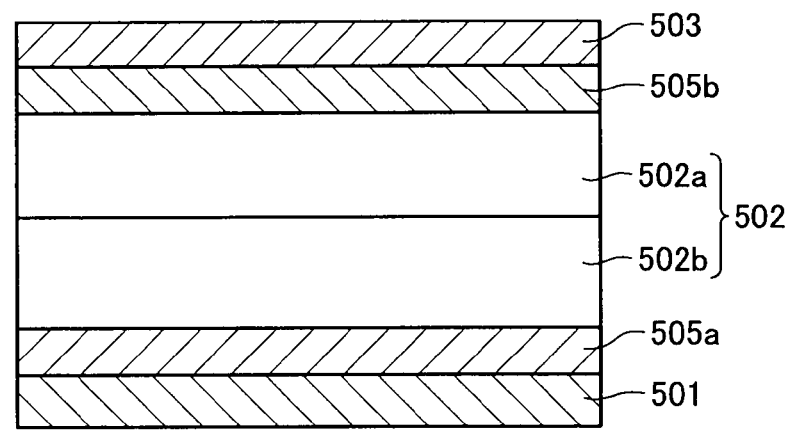

To efficiently carry out heating of the recording layer 502 in the reset operation, for example as shown in FIG. 32A, it is preferable to provide a heater layer 505 with a resistivity of $10^{-5}/\Omega$-cm or more at the side of upper electrode 503. Alternatively, such the heater layer 505 may be disposed at the lower electrode 501 as shown in FIG. 32B. Further, as shown in FIG. 32C, heater layers 505a and 505b may be formed at the sides of the electrodes 501 and 503, respectively. Specifically, to effectively heat the second compound layer 502b at the reset time, the heater structure shown in FIG. 32B is desirable.

These heater layers 505, 505a, 505b may be preferably formed of a thin and high-resistive film of the same kind of compound as the recording layer 502. Explaining in detail, the heater layer 505 or 505a disposed on the electrode 501 side is formed of the same kind of compound as the first compound layer 502a; and the heater layer 505 or 505b disposed on the electrode 503 side is formed of the same kind of compound as the second compound layer 502b.

In addition, it is permissible that the TiN film shown in FIG. 31 serves as the heater layers described above.

Further, the first compound layer 502a or the second compound layers 502b in the recording layer 502 may possess a plurality of microstructures that have in common a continuous crystalline path between the electrodes 501 and 503 in at least a part of the first compound layer 502a or the second compound layer 502b. The first compound layer 502a or the second compound layer 502b may consist of a single-crystal film containing no grain boundary or a crystal film, the grain size of which is smaller than the lateral size of a memory cell.

A polycrystalline or amorphous film may also be used if the first compound layer 502a or the second compound layer 502b which contains at least one columnar crystalline region that forms a continuous crystalline path between the electrodes. Both the first and second compound layers 502a and 502b may be formed to be crystalline in at least part of the device area. The first compound layer 502a may consist of a single-crystalline film or a textured film within the recording layer 502. This embodiment remains effective regardless of the way in which the crystalline path between the electrode 501 and the second compound layer 502b and between the electrode 503 and the first compound layer 502a is formed. The first compound layer 502a or the second compound layer 502b may, for example, be deposited during device manufacture in an amorphous or nanocrystalline form, and the columnar crystalline region is formed by local Joule heating during an initial forming stage of the device under a suitable bias current. As a result, the set/reset operation described above will be achieved by use of the cation movement in the crystalline regions of the first compound layer 502a.

What is claimed is:

1. A resistance change memory device comprising:
a semiconductor substrate;
at least one cell array, in which memory cells are arranged, formed above the semiconductor substrate, each memory cell having a stack structure of a variable resistance element and an access element, the variable resistance element being set at a resistance value, the access element having such an off-state resistance value in a certain voltage range that is ten times or more as high as that in a select state; and
a read/write circuit formed on the semiconductor substrate as underlying the cell array for data reading and data writing in communication with the cell array, wherein
the variable resistance element has a recording layer with a first composite compound and a second composite compound stacked thereon, and wherein
the first composite compound is a metal oxide expressed by $ZnM_2O_4$ (where "M" is one selected from Mn and Co) while the second composite compound is another metal oxide expressed by $A_xMO_2$ (where "A" is one selected from Zn and Mg with a non-zero molar ratio "x"; and "M" is one selected from Ti and Mn).

2. The resistance change memory device according to claim 1, wherein the first composite compound is a spinel type of metal oxide while the second composite compound is a ramsdelite type of metal oxide.

3. The resistance change memory device according to claim 1, wherein the access element is a diode selected from a Zener diode, a PN junction diode and a Shottky diode.

4. The resistance change memory device according to claim 1, wherein the cell array comprises:
a plurality of bit lines arranged in parallel with each other;
a plurality of word lines arranged in parallel with each other and formed crossing the plurality of bit lines; and
a plurality of memory cells arranged at intersections of the bit lines and the word lines, each memory cell having one end connected to a bit line and an other end connected to a word line.

5. The resistance change memory device according to claim 4, wherein a plurality of cell arrays are stacked in such a manner that at least one of the bit lines and word lines are shared by two adjacent cell arrays.

6. A resistance change memory device comprising:
a semiconductor substrate;
at least one cell array, in which memory cells are arranged, formed above the semiconductor substrate, each memory cell having a stack structure of a variable resistance element and an access element, the variable resistance element being set at a resistance value, the access element having such an off-state resistance value in a certain voltage range that is ten times or more as high as that in a select state; and
a read/write circuit formed on the semiconductor substrate as underlying the cell array for data reading and data writing in communication with the cell array, wherein
the variable resistance element has a recording layer with a first composite compound and a second composite compound stacked thereon, and wherein
the first composite compound is a metal oxide expressed by $ZnM_2O_4$ (where "M" is one selected from $Ti_{0.5}Ni_{0.5}$ and $Sn_{0.5}Ni_{0.5}$) while the second composite compound is another metal oxide expressed by $A_xMO_2$ (where "A" is one selected from Zn and Mg with a non-zero molar ratio "x"; and "M" is one selected from Ti and Mn).

7. The resistance change memory device according to claim 6, wherein the first composite compound is a spinel type of metal oxide while the second composite compound is a ramsdelite type of metal oxide.

8. The resistance change memory device according to claim 6, wherein the access element is a diode selected from a Zener diode, a PN junction diode and a Shottky diode.

9. The resistance change memory device according to claim 6, wherein the cell array comprises:
a plurality of bit lines arranged in parallel with each other;
a plurality of word lines arranged in parallel with each other and formed crossing the plurality of bit lines; and
a plurality of memory cells arranged at intersections of the bit lines and the word lines, each memory cell having one end connected to a bit line and an other end connected to a word line.

10. The resistance change memory device according to claim 9, wherein a plurality of cell arrays are stacked in such a manner that at least one of the bit lines and word lines are shared by two adjacent cell arrays.

11. A resistance change memory device comprising:
a semiconductor substrate;
at least one cell array, in which memory cells are arranged, formed above the semiconductor substrate, each memory cell having a stack structure of a variable resistance element and an access element, the variable resistance element being set at a resistance value, the access element having such an off-state resistance value in a certain voltage range that is ten times or more as high as that in a select state; and
a read/write circuit formed on the semiconductor substrate as underlying the cell array for data reading and data writing in communication with the cell array, wherein
the variable resistance element has a recording layer with a first composite compound and a second composite compound stacked thereon, and wherein
the first composite compound is a metal oxide expressed by $ZnMn_2O_4$ while the second composite compound is another metal oxide expressed by $ZnM_2O_4$ (where "M" is one selected from Ti and Al).

12. The resistance change memory device according to claim 11, wherein the first composite compound $ZnMn_2O_4$ is a spinel type of metal oxide while the second composite compound $ZnM_2O_4$ is another spinel type of metal oxide.

13. The resistance change memory device according to claim 11, wherein the access element is a diode selected from a Zener diode, a PN junction diode and a Shottky diode.

14. The resistance change memory device according to claim 11, wherein the cell array comprises:
a plurality of bit lines arranged in parallel with each other;
a plurality of word lines arranged in parallel with each other and formed crossing the plurality of bit lines; and
a plurality of memory cells arranged at intersections of the bit lines and the word lines, each memory cell having one end connected to a bit line and an other end connected to a word line.

15. The resistance change memory device according to claim 14, wherein a plurality of cell arrays are stacked in such a manner that at least one of the bit lines and word lines are shared by two adjacent cell arrays.

16. A resistance change memory device comprising:
a semiconductor substrate;
at least one cell array, in which memory cells are arranged, formed above the semiconductor substrate, each memory cell having a stack structure of a variable resistance element and an access element, the variable resistance element being set at a resistance value, the access element having such an off-state resistance value in a certain voltage range that is ten times or more as high as that in a select state; and
a read/write circuit formed on the semiconductor substrate as underlying the cell array for data reading and data writing in communication with the cell array, wherein
the variable resistance element has a recording layer with a first composite compound and a second composite compound stacked thereon, and wherein
the first composite compound is a metal oxide expressed by $CuCoO_2$ while the second composite compound is another metal oxide expressed by $ATiO_3$ (where "A" is one selected from Cu and Zn).

17. The resistance change memory device according to claim 16, wherein the first composite compound $CuCoO_2$ is a delafossite type of metal oxide while the second composite compound $ATiO_3$ is an ilmenite type of metal oxide.

18. The resistance change memory device according to claim 16, wherein the access element is a diode selected from a Zener diode, a PN junction diode and a Shottky diode.

19. The resistance change memory device according to claim 16, wherein the cell array comprises:
a plurality of bit lines arranged in parallel with each other;
a plurality of word lines arranged in parallel with each other and formed crossing the plurality of bit lines; and
a plurality of memory cells arranged at intersections of the bit lines and the word lines, each memory cell having one end connected to a bit line and an other end connected to a word line.

20. The resistance change memory device according to claim 19, wherein a plurality of cell arrays are stacked in such a manner that at least one of the bit lines and word lines are shared by two adjacent cell arrays.

* * * * *